US012635363B2

(12) United States Patent
Lee et al.

(10) Patent No.: US 12,635,363 B2
(45) Date of Patent: May 19, 2026

(54) ORGANIC LIGHT EMITTING DISPLAY APPARATUS

(71) Applicant: LG Display Co., Ltd., Seoul (KR)

(72) Inventors: Sung Jin Lee, Paju-si (KR); Dong Chae Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 550 days.

(21) Appl. No.: 18/156,202

(22) Filed: Jan. 18, 2023

(65) Prior Publication Data

US 2023/0363215 A1    Nov. 9, 2023

(30) Foreign Application Priority Data

Apr. 1, 2022    (KR) ......................... 10-2022-0041051

(51) Int. Cl.
*H10K 59/126*      (2023.01)
*H10D 86/40*       (2025.01)
*H10K 59/121*      (2023.01)

(52) U.S. Cl.
CPC ......... *H10K 59/126* (2023.02); *H10D 86/481* (2025.01); *H10K 59/1216* (2023.02)

(58) Field of Classification Search
CPC ............. H10K 59/126; H10K 59/1216; H10K 59/1213; H10K 50/865; H10D 86/481; H10D 30/6723; H10D 86/423; H10D 86/60
See application file for complete search history.

(56) References Cited

U.S. PATENT DOCUMENTS

| | | | |
|---|---|---|---|
| 2013/0221381 A1* | 8/2013 | Shin | H10D 86/481 |
| | | | 438/34 |
| 2016/0307988 A1 | 10/2016 | Kim et al. | |
| 2017/0207289 A1* | 7/2017 | Kang | H10K 59/1216 |
| 2019/0006521 A1 | 1/2019 | Noh et al. | |
| 2019/0206979 A1* | 7/2019 | Han | H10D 86/00 |
| 2019/0214447 A1 | 7/2019 | Kim et al. | |

(Continued)

FOREIGN PATENT DOCUMENTS

| | | | | | |
|---|---|---|---|---|---|
| KR | 20080102664 A | * | 11/2008 | .......... | H10D 86/441 |
| KR | 10-2019-0003150 A | | 1/2019 | | |

(Continued)

OTHER PUBLICATIONS

Ministry of Intellectual Property of Korea, Office Action, Korean Patent Application No. 10-2022-0041051, Dec. 16, 2025, 22 pages.

*Primary Examiner* — Khaja Ahmad
*Assistant Examiner* — Alvin L Lee
(74) *Attorney, Agent, or Firm* — Fenwick & West LLP

(57)    ABSTRACT

Disclosed is an organic light emitting display apparatus including hybrid type thin film transistors comprising a driving thin film transistor of a subpixel including an oxide semiconductor pattern such that the s-factor value of the driving thin film transistor is increased and a thin film transistor formed in at least one of a non-active area and an active area, the thin film transistor including a polycrystalline semiconductor pattern, wherein the organic light emitting display apparatus includes various storage capacitors formed by imparting conductivity to the polycrystalline semiconductor pattern and the oxide semiconductor pattern.

19 Claims, 18 Drawing Sheets

(56) References Cited

U.S. PATENT DOCUMENTS

2021/0036197 A1* 2/2021 Noh .................... H01L 25/0753
2021/0104588 A1    4/2021 Han et al.
2021/0408061 A1* 12/2021 Shin .................. H10K 59/1213

FOREIGN PATENT DOCUMENTS

KR    10-2020-0098723 A    8/2020
KR    10-2021-0042197 A    4/2021

* cited by examiner

FIG. 3

ORGANIC LIGHT EMITTING DISPLAY APPARATUS

CROSS-REFERENCE TO RELATED APPLICATION

This application claims the benefit of Republic of Korea Patent Application No. 10-2022-0041051, filed on Apr. 1, 2022, which is hereby incorporated by reference in its entirety.

BACKGROUND

Field of Technology

The present disclosure relates to an organic light emitting display apparatus, and more particularly to an organic light emitting display apparatus including a driving thin film transistor, among a plurality of thin film transistors, wherein an oxide semiconductor is used as an active layer of the driving thin film transistor and wherein the organic light emitting display apparatus includes a capacitor structure having high storage capacity within a small area, thereby implementing a high-resolution display apparatus.

Discussion of the Related Art

With recent development of multimedia, importance of flat display apparatuses has increased. In response thereto, flat display apparatuses, such as a liquid crystal display apparatus, a plasma display apparatus, and an organic light emitting display apparatus, have been commercialized. Among such flat display apparatuses, the organic light emitting display apparatus has been widely used due to a fast response time, high luminance, and wide viewing angle.

In the organic light emitting display apparatus, a plurality of pixels are disposed in a matrix form, and a light emitting device unit represented by an organic light emitting layer and a pixel circuit unit represented by a thin film transistor are provided in each pixel. The pixel circuit unit includes a plurality of thin film transistors, such as a driving thin film transistor (TFT) configured to supply driving current in order to operate an organic light emitting device and a switching thin film transistor (TFT) configured to supply a gate signal to the driving thin film transistor. In addition, each pixel includes a capacitor configured to maintain a data signal for a predetermined time, and the space in the subpixel in which the capacitor is installed is reduced as the resolution of the display apparatus is increased. Each pixel needs a capacitor having a predetermined capacity to maintain a data signal during one frame. When the space is reduced, however, the capacity of the capacitor is reduced.

SUMMARY

Accordingly, the present disclosure is directed to an organic light emitting display apparatus that substantially obviates one or more problems due to limitations and disadvantages of the related art.

It is an object of the present disclosure to provide an organic light emitting display apparatus having a capacitor structure capable of providing a capacitance value of a predetermined capacity or more in a subpixel while realizing high resolution.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display apparatus includes a substrate including an active area and a non-active area disposed around the active area, a lower buffer layer formed on the substrate, a first thin film transistor disposed in at least one of the active area and the non-active area, the first thin film transistor including a first semiconductor pattern, a first gate electrode, a first source electrode, and a first drain electrode formed on the lower buffer layer, an upper buffer layer disposed on the first semiconductor pattern, a second thin film transistor disposed on the upper buffer layer in the active area, the second thin film transistor including a second semiconductor pattern, a second gate electrode, a second source electrode, and a second drain electrode, a first light shielding pattern disposed between the lower buffer layer and the second semiconductor pattern, the first light shielding pattern overlapping the second semiconductor pattern, and a storage capacitor including at least two electrodes overlapping each other, the at least two electrodes including at least one of a conductive pattern formed by imparting conductivity to the same material as the first semiconductor pattern and a conductive pattern formed by imparting conductivity to the second semiconductor pattern.

The second semiconductor pattern may be made of an oxide semiconductor material, and the second thin film transistor may be a driving thin film transistor.

The first light shielding pattern may be located in the upper buffer layer and may be electrically connected to the second source electrode.

The storage capacitor may include a first electrode of the storage capacitor formed by imparting conductivity to the same material as the first semiconductor pattern and a second electrode of the storage capacitor constituted by a conductive layer disposed between the first semiconductor pattern and the second gate electrode.

The second electrode of the storage capacitor may be any one of a conductive layer disposed on the same layer as the first light shielding pattern and a conductive layer disposed between the first gate electrode and the first light shielding pattern.

The first semiconductor pattern may be made of a polycrystalline semiconductor material.

In addition, the storage capacitor may include a first electrode of the storage capacitor formed by imparting conductivity to the same material as the first semiconductor pattern, a second electrode of the storage capacitor constituted by a conductive layer disposed between the first semiconductor pattern and the first light shielding pattern, and a third electrode of the storage capacitor disposed on the same layer as the first light shielding pattern, the third electrode of the storage capacitor being made of the same material as the first light shielding pattern, wherein the first electrode of the storage capacitor and the third electrode of the storage capacitor may be electrically connected to each other.

In addition, the storage capacitor may include a first electrode of the storage capacitor formed by imparting conductivity to the same material as the first semiconductor pattern, a second electrode of the storage capacitor constituted by a conductive layer disposed between the first semiconductor pattern and the first light shielding pattern, a third electrode of the storage capacitor disposed on the same layer as the first light shielding pattern, the third electrode of the storage capacitor being made of the same material as the first light shielding pattern, and a fourth electrode of the storage capacitor disposed on the same layer as the second gate electrode, the fourth electrode of the storage capacitor being made of the same material as the second gate electrode, wherein the first electrode of the storage capacitor and the third electrode of the storage capacitor may be electrically connected to each other, and the second electrode of the storage capacitor and the fourth electrode of the storage capacitor may be electrically connected to each other.

In addition, the storage capacitor may include a first electrode of the storage capacitor formed by imparting conductivity to the same material as the second semiconductor pattern and a second electrode of the storage capacitor disposed on the same layer as the first light shielding pattern, the second electrode of the storage capacitor being made of the same material as the first light shielding pattern.

In addition, the storage capacitor may include a first electrode of the storage capacitor made of the same material as the second semiconductor pattern and a second electrode of the storage capacitor constituted by a metal layer disposed between the first light shielding pattern and the first semiconductor pattern.

In addition, the storage capacitor may include a first electrode of the storage capacitor formed by imparting conductivity to the same material as the second semiconductor pattern and a second electrode of the storage capacitor disposed on the same layer as the first gate electrode, the second electrode of the storage capacitor being made of the same material as the first gate electrode.

In addition, the storage capacitor may include a first electrode of the storage capacitor formed by imparting conductivity to the same material as the second semiconductor pattern, a second electrode of the storage capacitor disposed on the same layer as the first light shielding pattern, the second electrode of the storage capacitor being made of the same material as the first light shielding pattern, and a third electrode of the storage capacitor disposed on the same layer as the first gate electrode, the third electrode of the storage capacitor being made of the same material as the first gate electrode, wherein the first electrode of the storage capacitor and the third electrode of the storage capacitor may be electrically connected to each other.

In addition, the storage capacitor may include a first electrode of the storage capacitor formed by imparting conductivity to the same material as the second semiconductor pattern, a second electrode of the storage capacitor disposed on the same layer as the first light shielding pattern, the second electrode of the storage capacitor being made of the same material as the first light shielding pattern, a third electrode of the storage capacitor disposed on the same layer as the first gate electrode, the third electrode of the storage capacitor being made of the same material as the first gate electrode, and a fourth electrode of the storage capacitor disposed on the same layer as the second gate electrode, the fourth electrode of the storage capacitor being made of the same material as the second gate electrode, wherein the first electrode of the storage capacitor and the third electrode of the storage capacitor may be electrically connected to each other, and the second electrode of the storage capacitor and the fourth electrode of the storage capacitor may be electrically connected to each other.

In addition, the storage capacitor may include a first electrode of the storage capacitor formed by imparting conductivity to the same material as the second semiconductor pattern, a second electrode of the storage capacitor disposed on the same layer as the first light shielding pattern, the second electrode of the storage capacitor being made of the same material as the first light shielding pattern, a third electrode of the storage capacitor constituted by a conductive layer disposed between the first gate electrode and the first light shielding pattern, and a fourth electrode of the storage capacitor disposed on the same layer as the first gate electrode, the fourth electrode of the storage capacitor being made of the same material as the first gate electrode, wherein the first electrode of the storage capacitor and the third electrode of the storage capacitor may be electrically connected to each other, and the second electrode of the storage capacitor and the fourth electrode of the storage capacitor may be electrically connected to each other.

In addition, the storage capacitor may include a first electrode of the storage capacitor formed by imparting conductivity to the same material as the first semiconductor pattern, a second electrode of the storage capacitor made of the same material as the second semiconductor pattern, and a third electrode of the storage capacitor constituted by a conductive layer disposed between the first electrode of the storage capacitor and the second electrode of the storage capacitor.

In addition, the third electrode of the storage capacitor may be a conductive layer disposed on the same layer as the first light shielding pattern and made of the same material as the first light shielding pattern.

In addition, the third electrode of the storage capacitor may be constituted by a conductive layer disposed between the first gate electrode and the first light shielding pattern.

In addition, the storage capacitor may include a first electrode of the storage capacitor formed by imparting conductivity to the same material as the first semiconductor pattern, a second electrode of the storage capacitor formed by imparting conductivity to the same material as the second semiconductor pattern, a third electrode of the storage capacitor disposed on the same layer as the first light shielding pattern, the third electrode of the storage capacitor being made of the same material as the first light shielding pattern, and a fourth electrode of the storage capacitor constituted by a conductive layer disposed between the first electrode of the storage capacitor and the third electrode of the storage capacitor, wherein the first electrode of the storage capacitor and the third electrode of the storage capacitor may be electrically connected to each other, and the second electrode of the storage capacitor and the fourth electrode of the storage capacitor may be electrically connected to each other.

In addition, the storage capacitor may include a first electrode of the storage capacitor formed by imparting conductivity to the same material as the first semiconductor pattern, a second electrode of the storage capacitor formed by imparting conductivity to the same material as the second semiconductor pattern, a third electrode of the storage capacitor constituted by a conductive layer disposed between the first electrode of the storage capacitor and the second electrode of the storage capacitor, and a fourth electrode of the storage capacitor constituted by a conductive layer disposed on the second electrode of the storage capacitor, wherein the first electrode of the storage capacitor and the second electrode of the storage capacitor may be electrically connected to each other, and the third electrode of the storage capacitor and the fourth electrode of the storage capacitor may be electrically connected to each other.

In addition, the third electrode of the storage capacitor may be any one of a conductive layer disposed on the same layer as the first light shielding pattern and a conductive layer disposed between the first electrode of the storage capacitor and the first light shielding pattern, and the fourth electrode of the storage capacitor may be disposed on the same layer as the second gate electrode and may be made of the same material as the second gate electrode.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 3 is a circuit diagram of the subpixel of the organic light emitting display apparatus according to one embodiment of the present disclosure;

DETAILED DESCRIPTION

Figure 1:
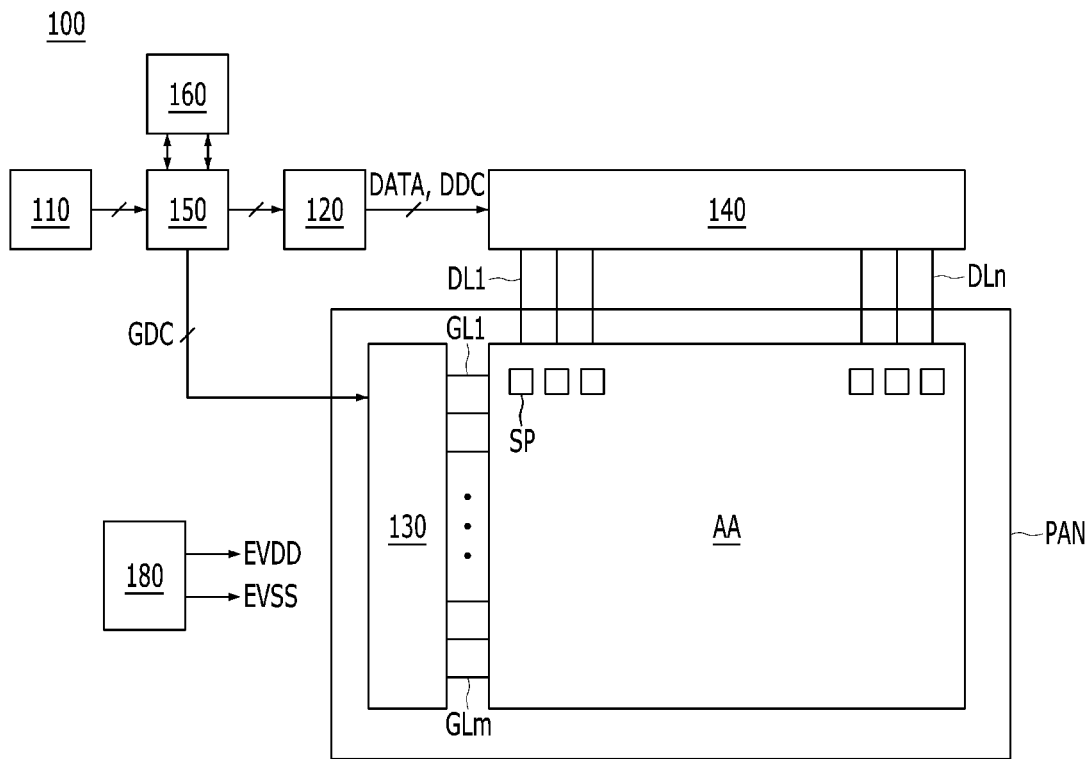
FIG. 1 is a schematic block diagram of an organic light emitting display apparatus according to one embodiment of the present disclosure.

Advantages and features of the present disclosure and methods of achieving the same will be more clearly understood from embodiments described below with reference to the accompanying drawings. However, the present disclosure is not limited to the following embodiments and may be implemented in various different forms. The embodiments are provided merely to complete the disclosure of the present disclosure and to fully inform a person having ordinary skill in the art to which the present disclosure pertains of the category of the invention.

In the drawings for explaining the exemplary embodiments of the present disclosure, for example, the illustrated shape, size, ratio, angle, and number are given by way of example, and thus, are not limitative of the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises", "includes", and "has", used in this specification, do not preclude the presence or addition of other elements unless used along with the term "only." The singular forms are intended to include the plural forms as well, unless the context clearly indicates otherwise.

In the interpretation of constituent elements, the constituent elements are interpreted as including an error range even if there is no explicit description thereof.

When describing positional relationships, for example, when the positional relationship between two parts is described using "on", "above", "below", "beside", or the like, one or more other parts may be located between the two parts unless the term "directly" or "closely" is used therewith.

When the temporal relationship between two actions is described using "after", "subsequently", "next", "before", or the like, the actions may not occur in succession unless the term "immediately" or "directly" is used therewith.

In the description of the various embodiments of the present disclosure, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present disclosure unless mentioned otherwise.

The respective features of the various embodiments of the present disclosure may be partially or wholly coupled to and combined with each other, and various technical linkages therebetween and operation methods thereof are possible. These various embodiments may be performed independently of each other, or may be performed in association with each other.

Hereinafter, the present disclosure will be described in detail with reference to the accompanying drawings.

Figure 2:
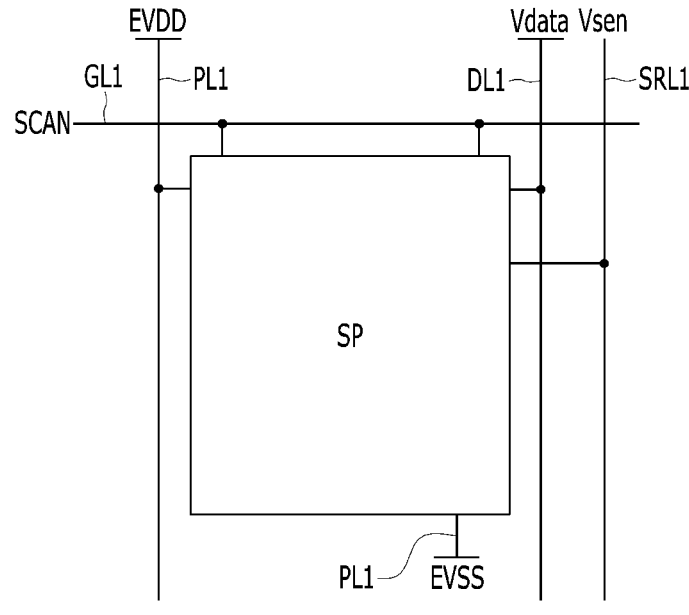
FIG. 2 is a schematic block diagram of a subpixel of the organic light emitting display apparatus according to one embodiment of the present disclosure.

FIG. 1 is a schematic block diagram of an organic light emitting display apparatus 100 according to one embodiment of the present disclosure, and FIG. 2 is a schematic block diagram of a subpixel SP shown in FIG. 1 according to one embodiment of the present disclosure.

As shown in FIG. 1, the organic light emitting display apparatus 100 includes a display panel PAN having an image processor 110, a deterioration compensator 150, a memory 160, a timing controller 120, a data driver 140, a power supply 180, and a gate driver 130 formed therein.

The image processor 110 outputs a driving signal for driving various kinds of devices together with image data supplied from the outside. For example, the driving signal output from the image processor 110 may include a data enable signal, a vertical synchronization signal, a horizontal synchronization signal, and a clock signal.

The deterioration compensator 150 (e.g., a circuit) calculates a deterioration compensation gain value of the subpixel SP of the display panel based on sensing voltage Vsen supplied from the data driver 140, calculates a dimming weight value based on the calculated deterioration compensation gain value, modulates input image data Idata of each subpixel SP of the current frame by the calculated deterioration compensation gain value and the calculated dimming weight value, and supplies modulated image data Mdata to the timing controller 120.

The timing controller 120 receives a driving signal together with the image data modulated by the deterioration compensator 150. The timing controller 120 generates and outputs a gate timing control signal GDC for controlling operation timing of the gate driver 130 and a data timing control signal DDC for controlling operation timing of the data driver 140 based on a driving signal input from the image processor 110.

In addition, the timing controller 120 controls operation timing of the gate driver 130 and the data driver 140 to acquire at least one sensing voltage Vsen from each subpixel SP and to supply the same to the deterioration compensator 150.

The gate driver 130 outputs a scan signal to the display panel PAN in response to the gate timing control signal GDC supplied from the timing controller 120. The gate driver 130 outputs a scan signal through a plurality of gate lines GL1 to GLm. The gate driver 130 may be configured in the form of an integrated circuit (IC); however, the present disclosure is not limited thereto. In particular, the gate driver 130 may be configured in a gate-in-panel (GIP) structure in which a thin film transistor is directly stacked on a substrate in the organic light emitting display apparatus 100. The GIP may include a plurality of circuits, such as a shift transistor and a level shifter.

The data driver 140 outputs data voltage to the display panel PAN in response to the data timing control signal DDC supplied from the timing controller 120. The data driver 140 samples and latches a digital data signal DATA supplied from the timing controller 120 to convert the same into an analog data voltage based on a gamma voltage. The data driver 140 outputs the data voltage through a plurality of data lines DL1 to DLn.

In addition, the data driver 140 supplies the sensing voltage Vsen input from the display panel PAN to the deterioration compensator 150 through a sensing voltage readout line.

The data driver 140 may be mounted on the display panel PAN in the form of an integrated circuit (IC) or may be formed as the result of various kinds of patterns and layers being directly stacked on the display panel PAN; however, the present disclosure is not limited thereto.

The power supply 180 outputs high-potential driving voltage EVDD and low-potential driving voltage EVSS that is less than the high-potential driving voltage EVDD and outputs the same to the display panel PAN. The high-potential driving voltage EVDD and the low-potential driving voltage EVSS are supplied to the display panel PAN through a power line. At this time, voltage output from the power supply 180 may be output to the data driver 140 or the gate driver 130 so as to be used to drive the same.

The display panel PAN displays an image in response to the data voltage and the scan signal supplied respectively from the data driver 140 and the gate driver 130 and the power supplied from the power supply 180.

The display panel PAN comprises a plurality of subpixels SP to display an actual image. The subpixels SP include a red subpixel, a green subpixel, and a blue subpixel, or may include a white (W) subpixel, a red (R) subpixel, a green (G) subpixel, and a blue (B) subpixel. The W, R, G, and B subpixels may be formed so as to have the same area, or may be formed so as to have different areas.

The memory 160 stores a lookup table of deterioration compensation gains and a deterioration compensation point in time of an organic light emitting device of each subpixel SP. The deterioration compensation point in time of the organic light emitting device may be the number of driving or driving time of an organic electroluminescent display panel.

As shown in FIG. 2, one subpixel SP may be connected to a gate line GL1, a data line DL1, a sensing voltage readout line SRL1, and a power line PL1. A driving method of the subpixel SP as well as the number of transistors and capacitors thereof is set depending on the configuration of a circuit thereof.

Figure 3:
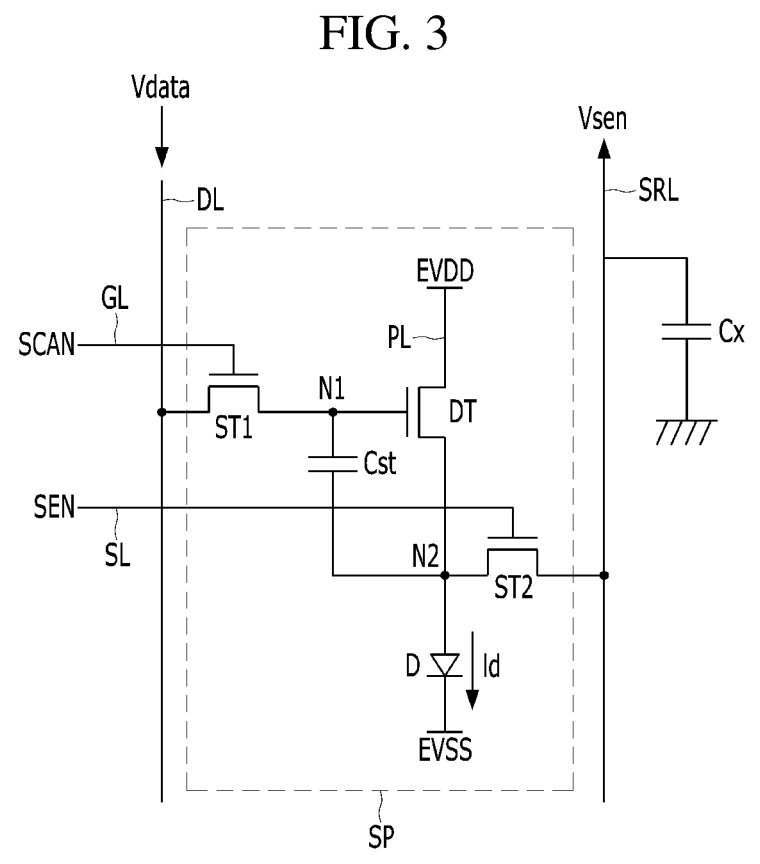

FIG. 3 is a circuit diagram of the subpixel SP of the organic light emitting display apparatus 100 according to the present disclosure.

As shown in FIG. 3, the organic light emitting display apparatus 100 according to the present disclosure includes a gate line GL, a data line DL, a power line PL, and a sensing line SL intersecting with each other to define a subpixel SP, and the subpixel SP includes a driving TFT DT, an organic light emitting device D, a storage capacitor Cst, a first switch TFT ST1, and a second switch TFT ST2.

The organic light emitting device D includes an anode connected to a second node N2, a cathode connected to an input of low-potential driving voltage EVSS, and an organic light emitting layer located between the anode and the cathode.

The driving TFT DT controls current Id that flows in the organic light emitting device D depending on a gate-source voltage Vgs. The driving TFT DT has a gate electrode connected to a first node N1, a drain electrode connected to the power line PL such that a high-potential driving voltage EVDD is provided thereto, and a source electrode connected to the second node N2.

The storage capacitor Cst is connected between the first node N1 and the second node N2.

The first switch TFT ST1 applies a data voltage Vdata charged in the data line DL to the first node N1 in response to a gate signal SCAN when the display panel PAN is driven. The first switch TFT ST1 has a gate electrode connected to the gate line GL such that a scan signal SCAN is input thereto, a drain electrode connected to the data line DL such that data voltage Vdata is input thereto, and a source electrode connected to the first node N1.

The second switch TFT ST2 switches current between the second node N2 and a sensing voltage readout line SRL to store source voltage of the second node N2 in a sensing capacitor Cx of the sensing voltage readout line SRL in response to a sensing signal SEN. The second switch TFT ST2 switches current between the second node N2 and the sensing voltage readout line SRL to reset source voltage of the driving TFT DT to initialization voltage Vpre in response to the sensing signal SEN when the display panel PAN is driven. The gate electrode of the second switch TFT ST2 is connected to the sensing line SL, the drain electrode thereof is connected to the second node N2, and the source electrode thereof is connected to the sensing voltage readout line SRL.

Meanwhile, the figure illustrates a 3T1C organic light emitting display apparatus including three thin film transistors and one storage capacitor; however, the present disclosure is not limited thereto. The organic light emitting display apparatus may have various structures, such as 4T1C, 5T1C, 6T1C, 7T1C, and 8T1C.

As can be seen from the above description, the thin film transistor disposed in the GIP structure and the thin film transistor disposed in the subpixel have different roles and need to have different operation characteristics accordingly. That is, a thin film transistor having high-speed operation characteristics is necessary for the GIP circuit, whereas a driving thin film transistor capable of performing sufficient gradation expression even during low-speed driving or a switching device having rapid operation characteristics and capable of effectively blocking current leakage in an off state is necessary for the subpixel depending on the role thereof.

In the organic light emitting display apparatus according to the present disclosure, therefore, a thin film transistor optimized for each role is provided.

Figure 4A:
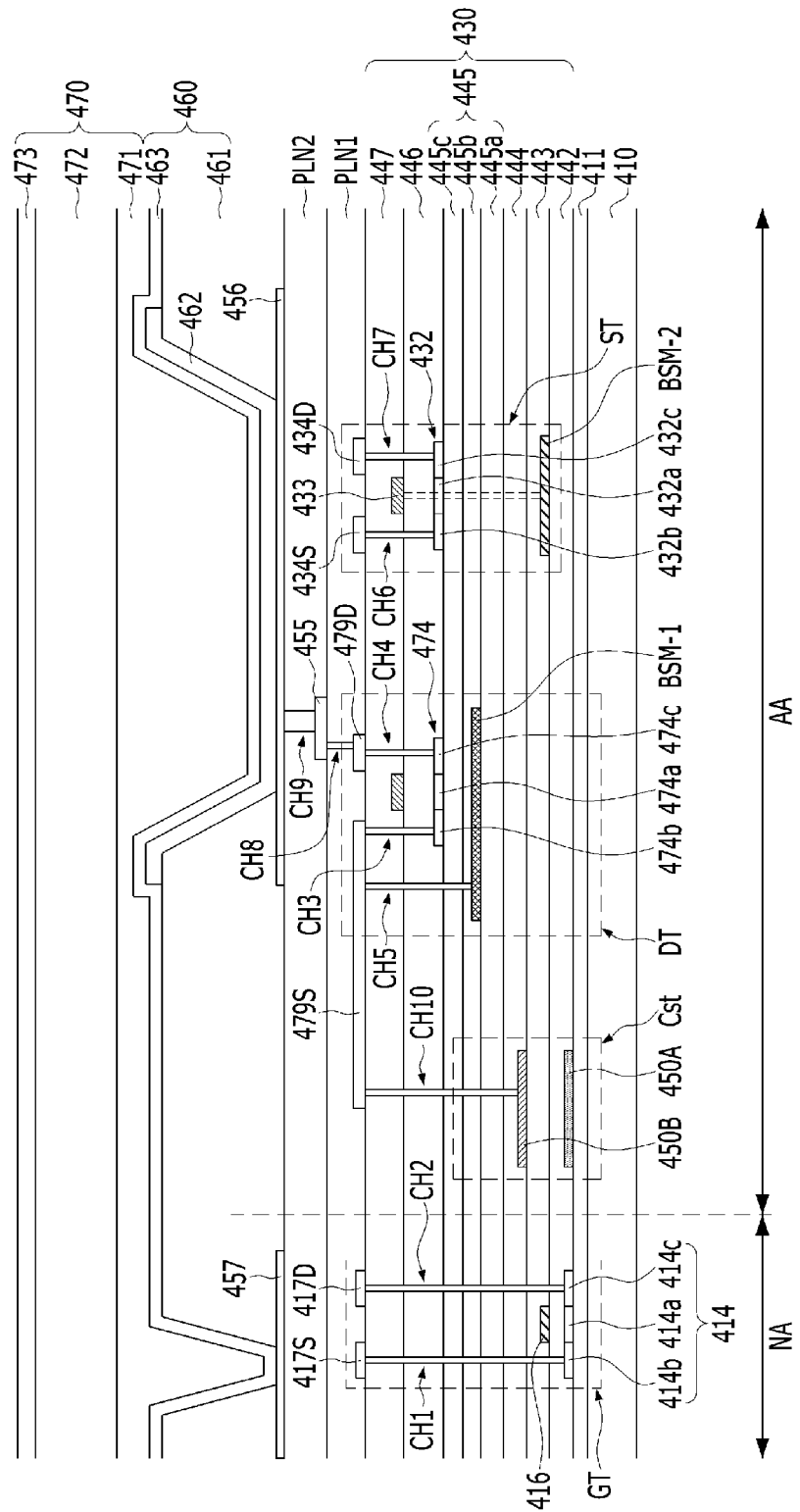
FIGS. 4A, 4B, 4C, 4D, 5A, 5B, 5C, 5D, 5E, 5F, 6A, 6B, 6C, 6D, and 6E are sectional views of embodiments of the present disclosure, each of which includes one thin film transistor disposed in a gate driving circuit unit in a non-active area, a driving thin film transistor and a switching thin film transistor disposed in an active area, and a storage capacitor.

FIG. 4A is a sectional view showing a first thin film transistor GT as a representative example of a thin film transistor disposed in a non-active area NA, particularly in a GIP area, and a driving thin film transistor DT configured to drive an organic light emitting device, a first switching thin film transistor ST, and a storage capacitor Cst disposed in a subpixel in an active area AA according to one embodiment of the present disclosure.

As shown in FIG. 4A, a driving thin film transistor DT and a first switching thin film transistor ST are disposed in a subpixel on a substrate 410. FIG. 4A shows the driving thin film transistor DT and only one first switching thin film transistor ST for convenience of description. A plurality of switching thin film transistors may be actually disposed on the substrate 410.

In addition, a plurality of first thin film transistors GT constituting a gate driving circuit may be disposed in a non-active area NA of the substrate 410.

In an embodiment of the present disclosure referring to FIG. 4A, the first thin film transistor GT is formed in the non-active area NA by way of example; however, the first thin film transistor GT may be formed in at least one of the active area AA and the non-active area NA.

The first thin film transistor GT includes a first polycrystalline semiconductor pattern 414 disposed on a lower buffer layer 411 formed on the substrate 410, a first gate insulation layer 422 configured to insulate the first polycrystalline semiconductor pattern 414, a first gate electrode 416 disposed on the first gate insulation layer 422, the first gate electrode 416 overlapping the first polycrystalline semiconductor pattern 414, a plurality of insulation layers formed on the first gate electrode 416, and a first source electrode 417A and a first drain electrode 417D disposed on the plurality of insulation layers.

The substrate 410 may have a multilayer structure in which organic films and inorganic films are alternately stacked. For example, the substrate 410 may be formed as the result of organic films, such as polyimide, and inorganic films, such as silicon dioxide ($SiO_2$), being alternately stacked.

The lower buffer layer 411 is formed on the substrate 410. The lower buffer layer 411, which is configured to prevent permeation of external moisture, may be configured by stacking a plurality of silicon dioxide ($SiO_2$) films.

The first polycrystalline semiconductor pattern 414 is formed on the lower buffer layer 411. The first polycrystalline semiconductor pattern 414, which is constituted by a polycrystalline semiconductor, includes a first channel area 414$a$ configured to allow an electric charge to move therethrough, and a first source area 414$b$ and a first drain area 414$c$ adjacent to the first channel area 414$a$ in the state in which the first channel area 414$a$ is interposed therebetween. Each of the first source area 414$b$ and a first drain area 414$c$ is an area imparted conductivity by doping an intrinsic polycrystalline semiconductor pattern with dopant ions, such as phosphorus (P) or boron (B).

The first polycrystalline semiconductor pattern 414 includes a first channel area 414$a$ and a first source area 414$b$ and a first drain area 414$c$ adjacent to the first channel area 414$a$ in the state in which the first channel area 414$a$ is interposed therebetween.

The first gate insulation layer 422 is formed by depositing an inorganic insulation layer, such as silicon dioxide ($SiO_2$), on the entire surface of the substrate 410 on which the first polycrystalline semiconductor pattern 414 is formed. The first gate insulation layer 422 protects and insulates the first polycrystalline semiconductor pattern 414 from the outside.

The first gate electrode 416 may be a metal material. For example, the first gate electrode 416 may be a single layer or multiple layers made of any one of molybdenum (Mo), aluminum (Al), chromium (Cr), gold (Au), titanium (Ti), nickel (Ni), neodymium (Nd), and copper (Cu) or an alloy thereof; however, the present disclosure is not limited thereto.

The first gate electrode 416 is disposed on the first gate insulation layer 422 so as to overlap the first channel area 414$a$.

A plurality of insulation layers may be interposed between the first gate electrode 416 and a first source electrode 417S and a first drain electrode 417D.

Referring to FIG. 4A, the plurality of insulation layers may include a first interlayer insulation layer 443, which contacts an upper surface of the first gate electrode 416, and a second interlayer insulation layer 455, an upper buffer layer 445, a second gate insulation layer 446, and a third interlayer insulation layer 447 sequentially stacked thereon.

The first source electrode 417S and the first drain electrode 417D may be disposed on the third interlayer insulation layer 447. The first source electrode 417S and the first drain electrode 417D may be connected respectively to the first source area 414$b$ and the first drain area 414$c$ through a first contact hole CH1 and a second contact hole CH2 formed through the first gate insulation layer 422, the first interlayer insulation layer 443, the second interlayer insulation layer 455, the upper buffer layer 445, the second gate insulation layer 446, and the third interlayer insulation layer 447.

Meanwhile, a driving thin film transistor DT, a first switching thin film transistor ST, and a storage capacitor Cst are disposed in the subpixel in the active area AA. The driving thin film transistor DT is formed on the upper buffer layer 445.

In an embodiment of the present disclosure, the driving thin film transistor DT includes a first oxide semiconductor pattern 474 and a second gate electrode 478, a second source electrode 479S, and a second drain electrode 479D overlapping the first oxide semiconductor pattern 474.

An oxide semiconductor material may be an oxide of a metal, such as zinc (Zn), indium (In), gallium (Ga), tin (Sn), or titanium (Ti), or a combination of a metal, such as zinc (Zn), indium (In), gallium (Ga), tin (Sn), or titanium (Ti), and an oxide thereof. More specifically, the oxide semiconductor material may include zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

In a conventional driving thin film transistor, a polycrystalline semiconductor pattern was used as an active layer. In the driving thin film transistor including the polycrystalline semiconductor pattern, however, current leakage occurred in an off state, whereby power was consumed. In particular, power consumption in the off state becomes more serious at the time of low-speed operation at which the display apparatus displays a document screen, such as a still image. In an embodiment of the present disclosure, therefore, a driving thin film transistor using an oxide semiconductor pattern, which is advantageous to prevention of current leakage, as an active layer is proposed.

In the driving thin film transistor using the oxide semiconductor pattern as the active layer, however, a current fluctuation value relative to a unit voltage fluctuation value is great due to material characteristics of the oxide semiconductor, whereby defects occur in a low gradation area in which precise current control is required in many cases. In an embodiment of the present disclosure, therefore, a driving thin film transistor having a fluctuation value of current at the active layer insensitive relative to a fluctuation value of voltage applied to the gate electrode is provided. That is, it is necessary to increase an s-factor value of the driving thin film transistor.

For reference, the s-factor, which is abbreviation of a "subthreshold slope," refers to voltage necessary to increase current ten (10) times and a reciprocal of the slope of a graph of an area equal to or less than the threshold voltage in a graph showing the characteristics of drain current to gate voltage (I-V curve).

When the s-factor is small, which means that the slope of the graph showing the characteristics of drain current to gate voltage (I-V) is large, the thin film transistor is turned on even with low voltage, and therefore the switching characteristics of the thin film transistor become better. In contrast, threshold voltage is reached within a short time, whereby sufficient gradation expression is difficult.

When the s-factor is large, which means that the slope of the graph showing the characteristics of drain current to gate voltage (I-V) is small, on/off response speed of the thin film transistor is reduced, whereby switching characteristics of the thin film transistor are reduced. Since threshold voltage is reached over a long time, however, sufficient gradation expression is possible.

The driving thin film transistor DT further includes a first light shielding pattern BSM-1 disposed in the upper buffer layer 445 so as to overlap the first oxide semiconductor pattern 474.

Substantially, the first light shielding pattern BSM-1 is inserted into the upper buffer layer 445. When describing the configuration in which the first light shielding pattern BSM-1 is disposed in the upper buffer layer 445 in more detail by reflecting process characteristics, however, the first light shielding pattern BSM-1 may be formed on a second sub-upper buffer layer 445a disposed on a second interlayer insulation layer 444. In addition, a second sub-upper buffer layer 445b completely covers the first light shielding pattern BSM-1 from above, and a third sub-upper buffer layer 445c is formed on the second sub-upper buffer layer 445b.

That is, the upper buffer layer 445 may have a structure in which the first sub-upper buffer layer 445a, the second sub-upper buffer layer 445b, and the third sub-upper buffer layer 445c are sequentially stacked.

Each of the first sub-upper buffer layer 445a and the third sub-upper buffer layer 445c may be constituted by a silicon dioxide ($SiO_2$) film.

Due to being constituted by a silicon dioxide ($SiO_2$) film including no hydrogen particles, each of the first sub-upper buffer layer 445a and the third sub-upper buffer layer 445c may serve as the base of a driving thin film transistor DT using an oxide semiconductor pattern, reliability of which may be damaged by hydrogen particles, as an active layer.

In contrast, the second sub-upper buffer layer 445b may be constituted by a silicon nitride (SiNx) film, which exhibits high hydrogen particle capture capability. The second sub-upper buffer layer 445b covers an upper surface and a side surface of the first light shielding pattern BSM-1 so as to completely seal the first light shielding pattern BSM-1.

The silicon nitride (SiNx) film has higher hydrogen particle capture capability than the silicon dioxide ($SiO_2$) film.

That is, the first interlayer insulation layer 443, which includes hydrogen particles, is located under the upper buffer layer 445, and hydrogen particles generated during hydrogenation of a first thin film transistor GT using a polycrystalline semiconductor pattern as an active layer may pass through the upper buffer layer 445, whereby reliability of the oxide semiconductor pattern located on the upper buffer layer 445 may be damaged. That is, when hydrogen particles permeate the oxide semiconductor pattern, thin film transistors each using an oxide semiconductor pattern as an active layer may have different threshold voltages or different channel conductivities depending on position thereof. In particular, it is important to secure reliability of the driving thin film transistor DT, which directly contributes to operation of the light emitting device.

In the embodiment of the present disclosure, therefore, the second sub-upper buffer layer 445b that completely covers the first light shielding pattern BSM-1 is formed, whereby it is possible to prevent decrease in reliability of the driving thin film transistor DT due to hydrogen particles.

Also, in the embodiment of the present disclosure, the first light shielding pattern BSM-1 may be constituted by a metal layer including titanium (Ti), which exhibits high hydrogen particle capture capability. For example, the first light shielding pattern BSM-1 may be a single titanium layer, a dual layer of molybdenum (Mo) and titanium (Ti), or an alloy of molybdenum (Mo) and titanium (Ti). However, the present disclosure is not limited thereto, and another metal layer including titanium (Ti) may be used.

Titanium (Ti) captures hydrogen particles spread in the upper buffer layer 445 to prevent arrival of the hydrogen particles at the first oxide semiconductor pattern 474. In the driving thin film transistor DT according to the embodiment of the present disclosure, therefore, the first light shielding pattern BSM-1 is formed of a metal layer, such as titanium, and a silicon nitride (SiNx) film, which exhibits high hydrogen particle capture capability, is configured to wrap the first light shielding pattern BSM-1, whereby decrease in reliability of the oxide semiconductor pattern due to hydrogen particles is prevented.

Meanwhile, the second sub-upper buffer layer 445b including silicon nitride (SiNx) may be deposited only on a part of an upper surface of the first sub-upper buffer layer 445a so as to selectively cover only the first light shielding pattern BSM-1 instead of being deposited on the entirety of the active area like the first sub-upper buffer layer 445a. The second sub-upper buffer layer 445b is formed of a material different from the first sub-upper buffer layer 445a, e.g., a silicon nitride (SiNx) film. When deposited on the entire surface of the active area, therefore, the second sub-upper buffer layer may be loosened. In order to remedy this, the second sub-upper buffer layer 445b may be selectively formed only at the position at which the first light shielding pattern BSM-1 necessary due to the function thereof is formed.

When viewed from below, the first light shielding pattern BSM-1 may be formed under the first oxide semiconductor pattern 474 so as to completely cover the first oxide semiconductor pattern 474.

In addition, the first oxide semiconductor pattern 474, which is an active layer, includes a second channel area 474a configured to allow an electric charge to move therethrough, and a second source area 474b and a second drain area 474c adjacent to the second channel area 474a in the state in which the second channel area 474a is interposed therebetween.

The second channel area 474a may be constituted by an intrinsic oxide semiconductor doped with no dopant. In addition, each of the second source area 474b and the second drain area 474c may be an area imparted conductivity by doping an intrinsic oxide semiconductor with III-group or V-group dopant ions.

Meanwhile, the second source electrode 479S of the driving thin film transistor DT may be electrically connected to the first light shielding pattern BSM-1.

When the first light shielding pattern BSM-1 is disposed so as to be located in the upper buffer layer 445 and the second source electrode 479S is electrically connected to the first light shielding pattern BSM-1, as described above, the following additional effects may be obtained.

These will be described with reference to FIGS. 7A and 7B.

Figures 7A, 7B:
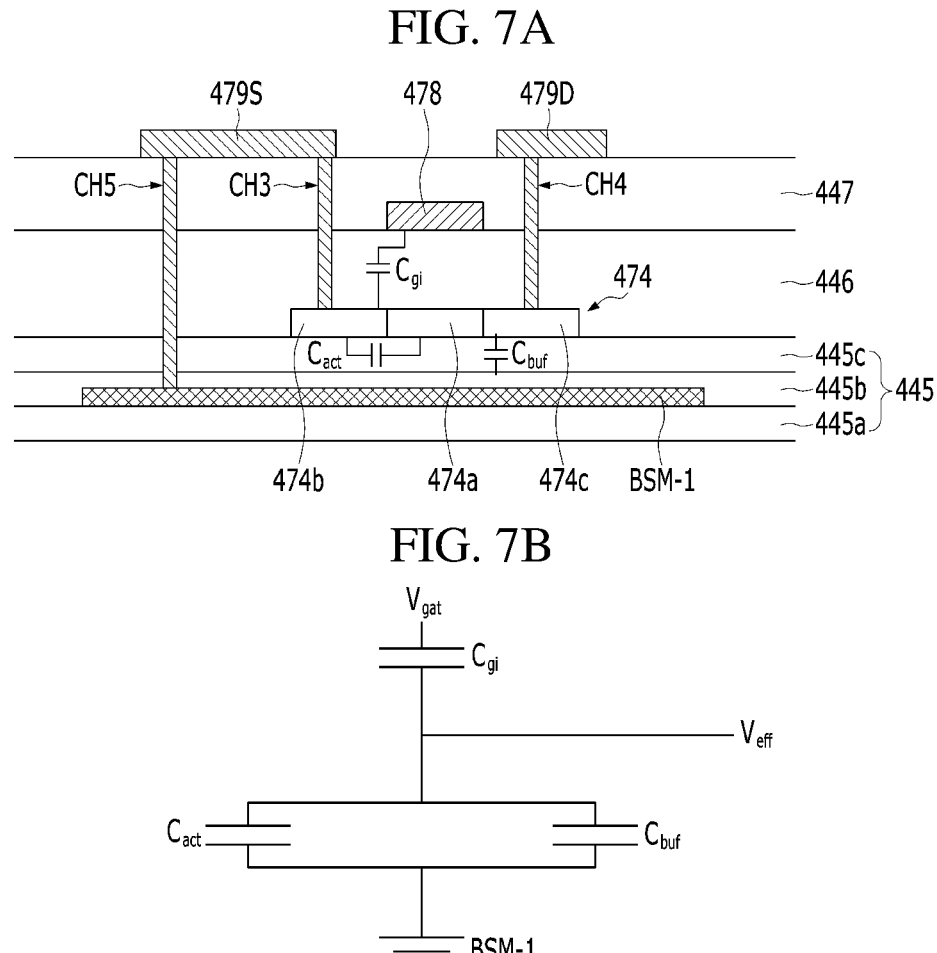
FIGS. 7A and 7B respectively illustrate a sectional view and a circuit diagram showing the relationship between parasitic capacitances generated in the driving thin film transistor according to one embodiment of the present disclosure.

FIG. 7A is a sectional view of the driving thin film transistor separated from FIG. 4A according to one embodiment of the present disclosure. FIG. 7B is a circuit diagram showing the relationship between parasitic capacitance generated in the driving thin film transistor and voltage applied thereto according to one embodiment of the present disclosure.

Referring to FIG. 7A, as a result of each of the second source area 474b and the second drain area 474c of the first oxide semiconductor pattern 474 being doped with a dopant, parasitic capacitance $C_{act}$ is generated in the first oxide semiconductor pattern 474, parasitic capacitance $C_{gi}$ is generated between the second gate electrode 478 and the first oxide semiconductor pattern 474, and parasitic capacitance $C_{buf}$ is generated between the first light shielding pattern BSM-1, which is electrically connected to the second source electrode 479S, and the first oxide semiconductor pattern 474.

Since the first oxide semiconductor pattern 474 and the first light shielding pattern BSM-1 are electrically connected to each other via the second source electrode 479S, the parasitic capacitance $C_{act}$ and the parasitic capacitance $C_{buf}$ are connected to each other in parallel, and the parasitic capacitance $C_{act}$ and the parasitic capacitance $C_{gi}$ are connected to each other in series. In addition, when gate voltage $V_{gat}$ is applied to the second gate electrode 478, effective voltage $V_{eff}$ actually applied to the first oxide semiconductor pattern 474 is expressed by the following equation.

$$\Delta V = Cgi/(Cgi+Cact+Cbuf) \times \Delta Vgat$$

Since the effective voltage $V_{eff}$ applied to the first oxide semiconductor pattern 474 is inversely proportional to the parasitic capacitance $C_{buf}$, the effective voltage $V_{eff}$ applied to the first oxide semiconductor pattern 474 may be adjusted by adjusting the parasitic capacitance $C_{buf}$.

That is, when the first light shielding pattern BSM-1 is disposed adjacent to the first oxide semiconductor pattern 474 to increase the value of the parasitic capacitance $C_{buf}$, it is possible to reduce the actual value of current that flows in the first oxide semiconductor pattern 474.

That the value of effective current that flows in the first oxide semiconductor pattern 474 means that the control range of the driving thin film transistor DT that can be controlled through voltage $V_{gat}$ actually applied to the second gate electrode 478 is increased.

In an embodiment of the present disclosure, therefore, the first light shielding pattern BSM-1 is disposed closer to the first oxide semiconductor pattern 474 to increase the range within which the driving thin film transistor DT controls gradation. As a result, it is possible to precisely control the light emitting device even at a low gradation, and therefore it is possible to solve a screen smudge problem that frequently occurs at the low gradation.

Meanwhile, referring to FIG. 4A, the subpixel includes a first switching thin film transistor ST including an oxide semiconductor pattern. The first switching thin film transistor ST may be disposed between the data line and the driving thin film transistor DT. Although only one switching thin film transistor is shown in FIG. 4A, one or more switching thin film transistors may be disposed in the subpixel. That is, one or more switching thin film transistors may be disposed depending on various configurations of a pixel circuit in the subpixel, such as 3T1C, 4T1C, 5T1C, 6T1C, and 7T1C.

The first switching thin film transistor ST includes a second oxide semiconductor pattern 432, a third gate electrode 433, a third source electrode 434S, and a third drain electrode 434D.

The second oxide semiconductor pattern 432 includes a third channel area 432a and a third source area 432b and a third drain area 432c adjacent to the third channel area 432a in the state in which the third channel area 432a is interposed therebetween.

The third gate electrode 433 is located on the second oxide semiconductor pattern 432 in the state in which a second gate insulation layer 446 is interposed therebetween.

The third source electrode 434S and the third drain electrode 434D are located on the third gate electrode 433 in the state in which a third interlayer insulation layer 447 is interposed therebetween.

The third source electrode 434S and the third drain electrode 434D are connected respectively to the third source area 432b and the third drain area 432c through a sixth contact hole CH6 and a seventh contact hole CH7 formed through the second gate insulation layer 446 and the third interlayer insulation layer 447.

In addition, a second light shielding pattern BSM-2 may be disposed under the second oxide semiconductor pattern 432.

The second light shielding pattern BSM-2 may be disposed under the second oxide semiconductor pattern 432 while overlapping the second oxide semiconductor pattern 432 in order to protect the second oxide semiconductor pattern 432 from external light.

The second light shielding pattern BSM-2 may be formed on a first gate insulation layer 442. Since the second light shielding pattern BSM-2 may reduce the s-factor value of the second oxide semiconductor pattern 432, however, the second light shielding pattern BSM-2 may not be disposed under the second oxide semiconductor pattern 432 in another embodiment.

When the second light shielding pattern BSM-2 is disposed under the second oxide semiconductor pattern 432 in a first embodiment, however, the second light shielding pattern BSM-2 may be disposed at a lower layer than the first light shielding pattern BSM-1. That is, the second light shielding pattern BSM-2 may be disposed at a lower layer located under the first light shielding pattern BSM-1 such that the distance between the second oxide semiconductor pattern 432 and the second light shielding pattern BSM-2 is greater than the distance between the first light shielding pattern BSM-1 and the first oxide semiconductor pattern 474. When the second light shielding pattern BSM-2 is disposed under the second oxide semiconductor pattern 432 so as to be disposed at a lower layer located under the first light shielding pattern BSM-1, it is possible to implement a first switching thin film transistor ST having high-speed operation characteristics. Of course, the first switching thin film transistor ST may not include the second light shielding pattern BSM-2.

Meanwhile, referring to FIG. 4A, the subpixel further includes a storage capacitor Cst.

The storage capacitor Cst stores data voltage applied through the data line for a predetermined period and provides the same to the organic light emitting device. As the value of the storage capacitor is further increased, it is possible to more stably provide data voltage to the organic light emitting device.

The storage capacitor may include at least two conductive layers corresponding to each other in the state in which a dielectric is interposed therebetween. In order to increase capacitance of the storage capacitor, a plurality of conductive layers may be connected to each other in parallel while corresponding to each other.

In a first embodiment of the present disclosure referring to FIG. 4A, two conductive layers of the storage capacitor Cst constitute an electrode of the storage capacitor while facing each other in the state in which an insulation layer is interposed therebetween.

Referring to FIG. 4A, the storage capacitor Cst may include a first electrode 450A of the storage capacitor made of the same material as the first semiconductor pattern 414 while being formed on the same layer as the first semiconductor pattern 414 and a second electrode 450B of the storage capacitor that may be constituted by a conductive layer disposed between the first light shielding pattern BSM-1 and the first electrode 450A of the storage capacitor while overlapping the first electrode 450A of the storage capacitor.

Conductivity may be imparted to the first electrode 450A of the storage capacitor by doping a polycrystalline semiconductor pattern constituting the first semiconductor pattern 414 with dopant ions. The ions doped into the first electrode 450A of the storage capacitor may be a III-group or V-group element injected into the first source area 414b and the first drain area 414c of the first semiconductor pattern 414, such as boron (B) or phosphorus (P).

The first electrode 450A of the storage capacitor may be simultaneously formed in the step of forming the first semiconductor pattern 414.

In addition, the second electrode 450B of the storage capacitor may be a metal conductive layer. The second electrode 450B of the storage capacitor may be formed on an upper surface of the first interlayer insulation layer 443, which covers the first gate electrode 416. The second electrode 450B of the storage capacitor may be constituted by a metal conductive layer. However, the second electrode 450B of the storage capacitor is not limited to a metal pattern.

The second electrode 450B of the storage capacitor may be a conductive pattern disposed so as to overlap the first electrode 450A of the storage capacitor and added to constitute the storage capacitor Cst. However, the conductive pattern constituting the second electrode 450B of the storage capacitor may be disposed in the non-active area so as to be used as a link line and may be used as various kinds of lines, whereby the degree of freedom in design of a thin film transistor array substrate may be increased.

A first gate insulation layer 442 and a first interlayer insulation layer 443, as dielectric layers, may be disposed between the first electrode 450A of the storage capacitor and the second electrode 450B of the storage capacitor.

The second electrode 450B of the storage capacitor may be formed by patterning the same material as the first gate electrode 416 on the same layer as the first gate electrode 416. In this case, however, when the first electrode 450A of the storage capacitor constituted by the first semiconductor pattern is doped with a dopant, the second electrode 450B of the storage capacitor may block doping of the first electrode 450A. In the embodiment of the present disclosure shown in FIG. 4A, therefore, the first interlayer insulation layer 443 is deposited, and then the second electrode 450B of the storage capacitor is formed on an upper surface thereof.

The second electrode 450B of the storage capacitor may be electrically connected to the second source electrode 479S via a tenth contact hole CH10.

Figure 4B:
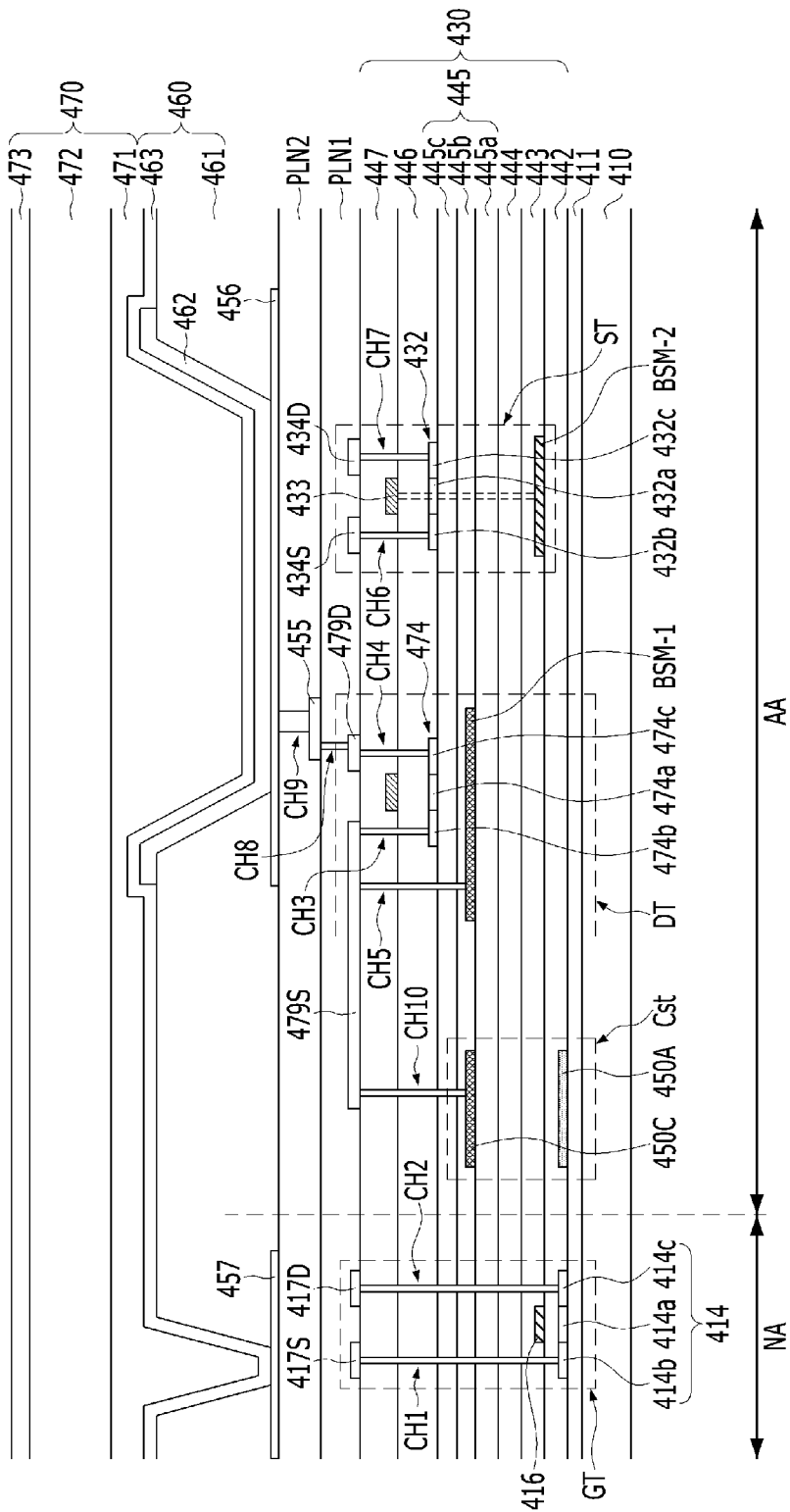

Meanwhile, referring to FIG. 4B, the electrode configuration of the storage capacitor Cst according to one embodiment of the present disclosure may be different from in the embodiment shown in FIG. 4A. The embodiment shown in FIG. 4B is identical to the embodiment shown in FIG. 4A except for the configuration of the storage capacitor.

Referring to FIG. 4B, the storage capacitor Cst may include a first electrode 450A of the storage capacitor made of the same material as the first polycrystalline semiconductor pattern 414 while being formed on the same layer as the first polycrystalline semiconductor pattern 414 and a third electrode 450C of the storage capacitor made of the same material as the first light shielding pattern BSM-1 while being formed on the same layer as the first light shielding pattern BSM-1, the third electrode 450C of the storage capacitor overlapping the first electrode 450A of the storage capacitor, as described with reference to FIG. 4A.

In the embodiment of the present disclosure referring to FIG. 4B, no separate mask may be used to constitute the storage capacitor Cst, whereby it is possible to reduce the number of masks used in the process. That is, the first electrode 450A of the storage capacitor may be designed in a mask used to form the first polycrystalline semiconductor pattern 414 so as to be simultaneously formed in the step of forming the first polycrystalline semiconductor pattern 414. In addition, the third electrode 450C of the storage capacitor may be designed in a mask used to form the first light shielding pattern BSM-1 so as to be simultaneously formed with the first light shielding pattern BSM-1.

Parts of a first gate insulation layer 442, a first interlayer insulation layer 443, a second interlayer insulation layer 444, and an upper buffer layer 445, as dielectric layers, may be disposed between the first electrode 450A of the storage capacitor and the third electrode 450C of the storage capacitor. Depending on circumstances, the second interlayer insulation layer 444 may be omitted.

As shown in FIG. 4B, a plurality of insulation layers may be interposed between the first electrode 450A of the storage capacitor and the third electrode 450C of the storage capacitor, whereby capacity of the storage capacitor may be reduced.

Figure 4C:
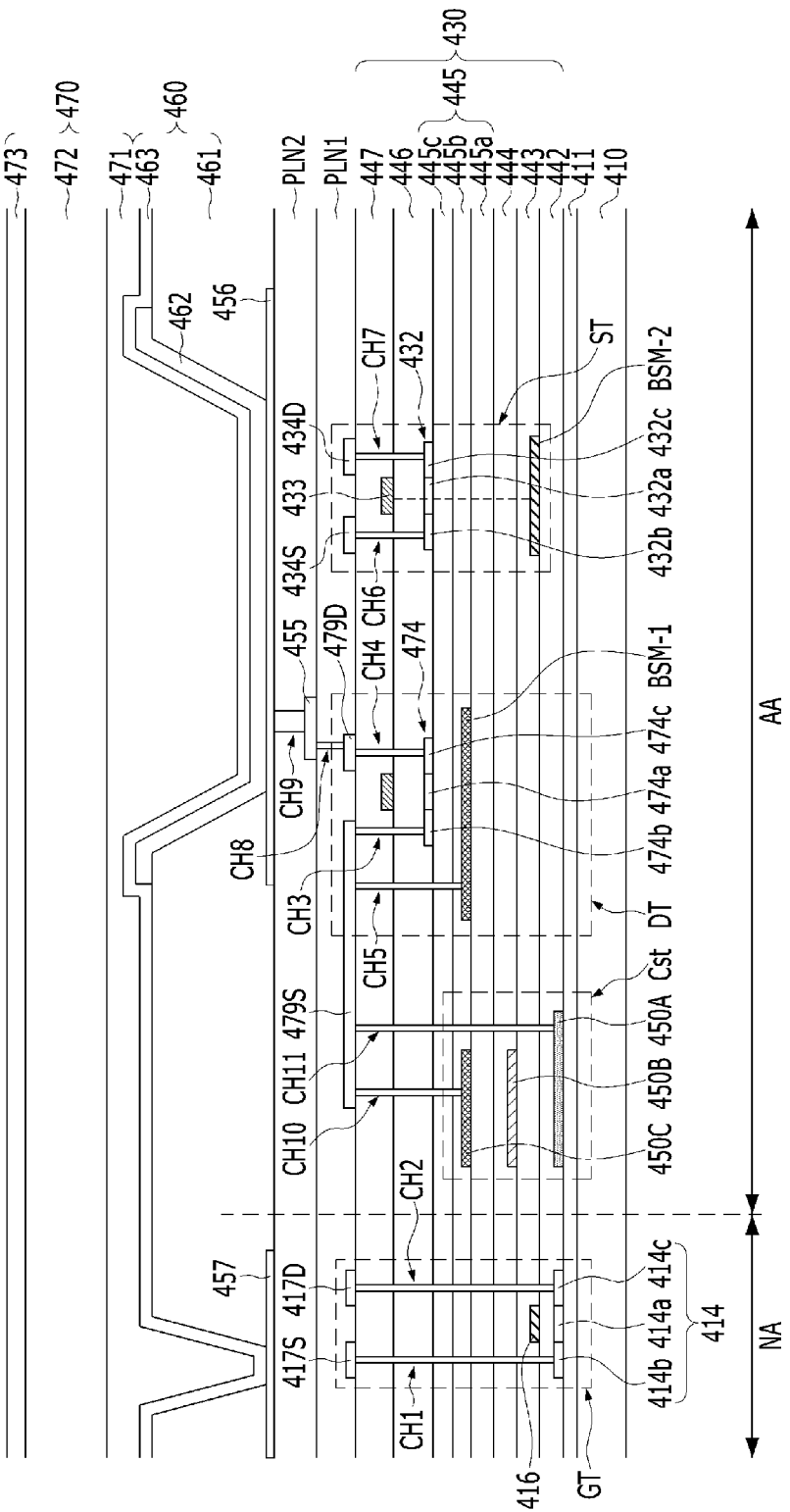

In another embodiment of the present disclosure referring to FIG. 4C, therefore, the storage capacitor Cst may include three electrodes connected to each other in parallel.

Referring to FIG. 4C, the storage capacitor Cst may include a first electrode 450A of the storage capacitor made of the same material as the first semiconductor pattern 414 while being formed on the same layer as the first semiconductor pattern 414, the first electrode 450A of the storage capacitor being imparted conductivity, a third electrode 450C of the storage capacitor made of the same material as the first light shielding pattern BSM-1 while being formed on the same layer as the first light shielding pattern BSM-1, and a second electrode 450B of the storage capacitor, which is a conductive layer disposed between the first electrode 450A of the storage capacitor and the third electrode 450C of the storage capacitor.

The first electrode 450A of the storage capacitor and the third electrode 450C of the storage capacitor may be electrically connected to each other. That is, the first electrode 450A of the storage capacitor and the third electrode 450C of the storage capacitor may be connected respectively to the second source electrode 479S through a tenth contact hole CH10 and an eleventh contact hole CH11 so as to be connected to each other.

Consequently, a sub-storage capacitor may be formed between the first electrode 450A of the storage capacitor and the second electrode 450B of the storage capacitor, a sub-storage capacitor may be formed between the second electrode 450B of the storage capacitor and the third electrode 450C of the storage capacitor, and the sub-storage capacitors may be connected to each other in parallel, whereby it is possible to increase capacity of the storage capacitor.

Figure 4D:
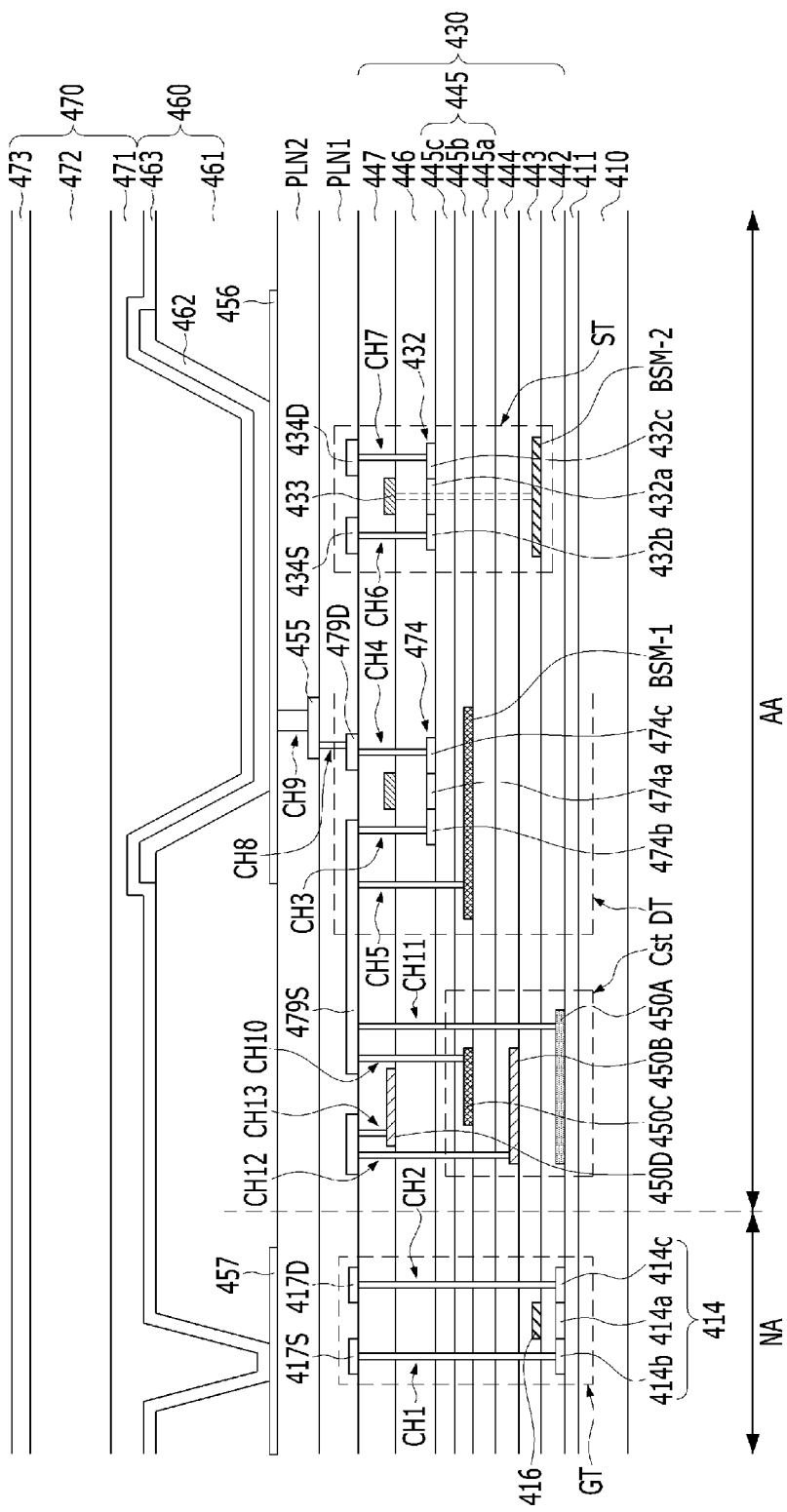

Meanwhile, referring to FIG. 4D, the storage capacitor Cst may include four electrodes in order to increase capacitance of the storage capacitor. That is, the storage capacitor Cst may further include a fourth electrode 450D of the storage capacitor made of the same material as the second gate electrode 478 while being formed on the same layer as the second gate electrode 478, in addition to the first electrode 450A of the storage capacitor, the second electrode 450B of the storage capacitor, and the third electrode 450C of the storage capacitor.

The first electrode 450A of the storage capacitor and the third electrode 450C of the storage capacitor may be electrically connected to each other, and the second electrode 450B of the storage capacitor and the fourth electrode 450D of the storage capacitor may be electrically connected to each other.

As a result, a first sub-storage capacitor may be formed between the first electrode 450A of the storage capacitor and the second electrode 450B of the storage capacitor, a second sub-storage capacitor may be formed between the second electrode 450B of the storage capacitor and the third electrode 450C of the storage capacitor, a third sub-storage capacitor may be formed between the third electrode 450C of the storage capacitor and the fourth electrode 450D of the storage capacitor, and the sub-storage capacitors may be connected to each other in parallel, whereby it is possible to increase capacity of the storage capacitor.

The first electrode 450A of the storage capacitor may be designed in a mask used to form the first semiconductor pattern 414, the third electrode 450C of the storage capacitor may be formed in a mask used to form the first light shielding pattern BSM-1, and the fourth electrode 450D of the storage capacitor may be designed in a mask used to form the second gate electrode 478, whereby it is possible to reduce the number of masks used.

Meanwhile, referring to FIGS. 5A to 5F that illustrate other embodiments of the present disclosure, a conductive pattern that may be made of the same material as the first oxide semiconductor pattern 474 while being formed on the same layer as the first oxide semiconductor pattern 474 may be used as one electrode in order to form the storage capacitor Cst.

Figure 5A:
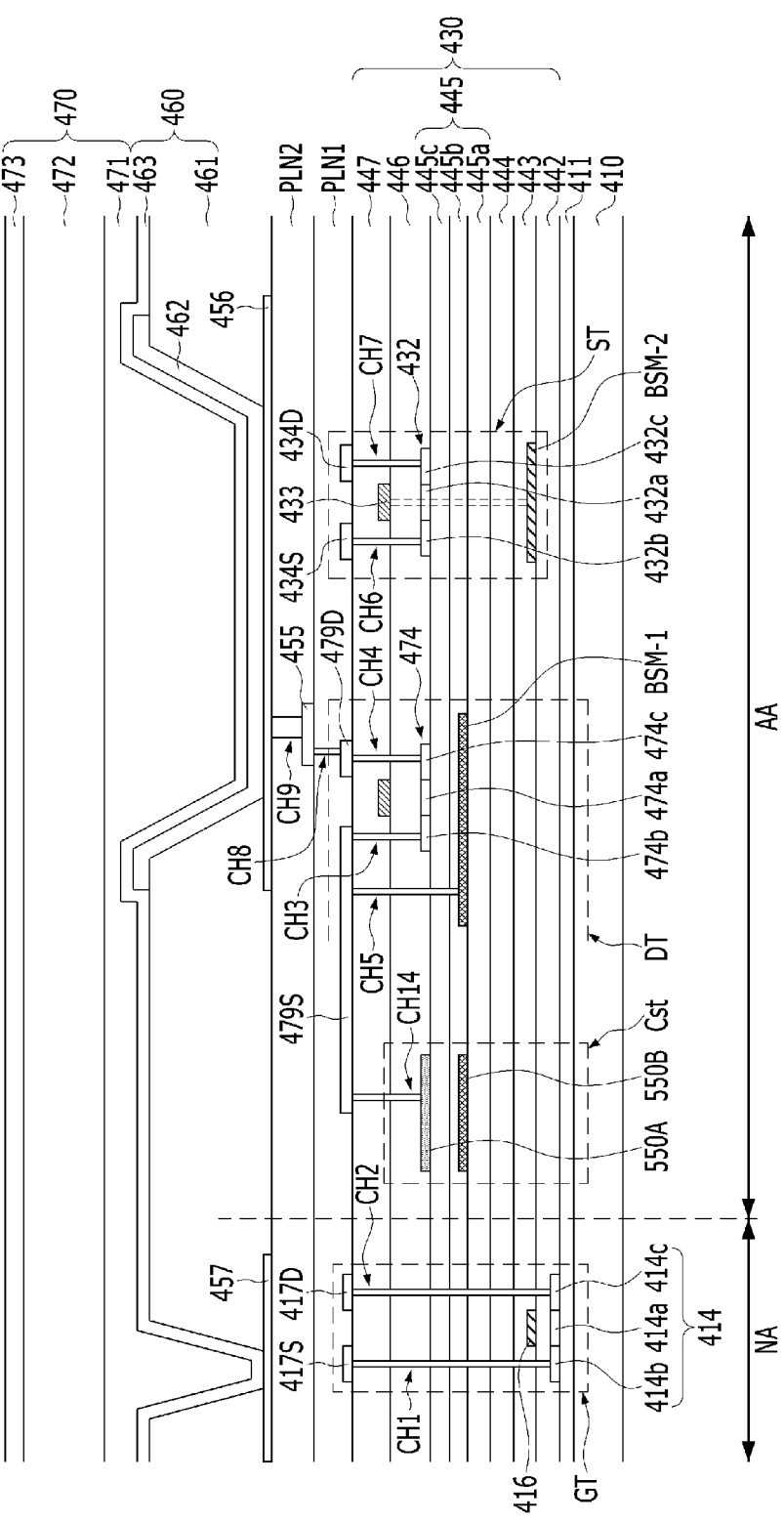

Referring to FIG. 5A, the storage capacitor Cst may use a conductive pattern imparted conductivity by doping the same material as the first oxide semiconductor pattern 474 with dopant ions while being formed on the same layer as the first oxide semiconductor pattern 474 as a first electrode 550A.

The first electrode 550A of the storage capacitor may be imparted conductivity by doping an oxide semiconductor pattern with dopant ions, such as boron or phosphorus.

The first electrode 550A of the storage capacitor may be designed in a mask used to form the first oxide semiconductor pattern 474 so as to be simultaneously formed in the step of forming the first oxide semiconductor pattern 474. As a result, no separate mask may be used to form the first electrode 550A of the storage capacitor.

In addition, the storage capacitor Cst may include a second electrode 550B of the storage capacitor disposed under the first electrode 550A of the storage capacitor while overlapping the first electrode 550A of the storage capacitor. The second electrode 550B of the storage capacitor may be a conductor made of the same material as the first light shielding pattern BSM-1 while being formed on the same layer as the first light shielding pattern BSM-1. Consequently, the second electrode 550B of the storage capacitor may be designed in a mask used to form the first light shielding pattern BSM-1 so as to be simultaneously formed in the step of forming the first light shielding pattern BSM-1.

A part of an upper buffer layer 445, as a dielectric, may be disposed between the first electrode 550A of the storage capacitor and the second electrode 550B of the storage capacitor.

Figure 5B:
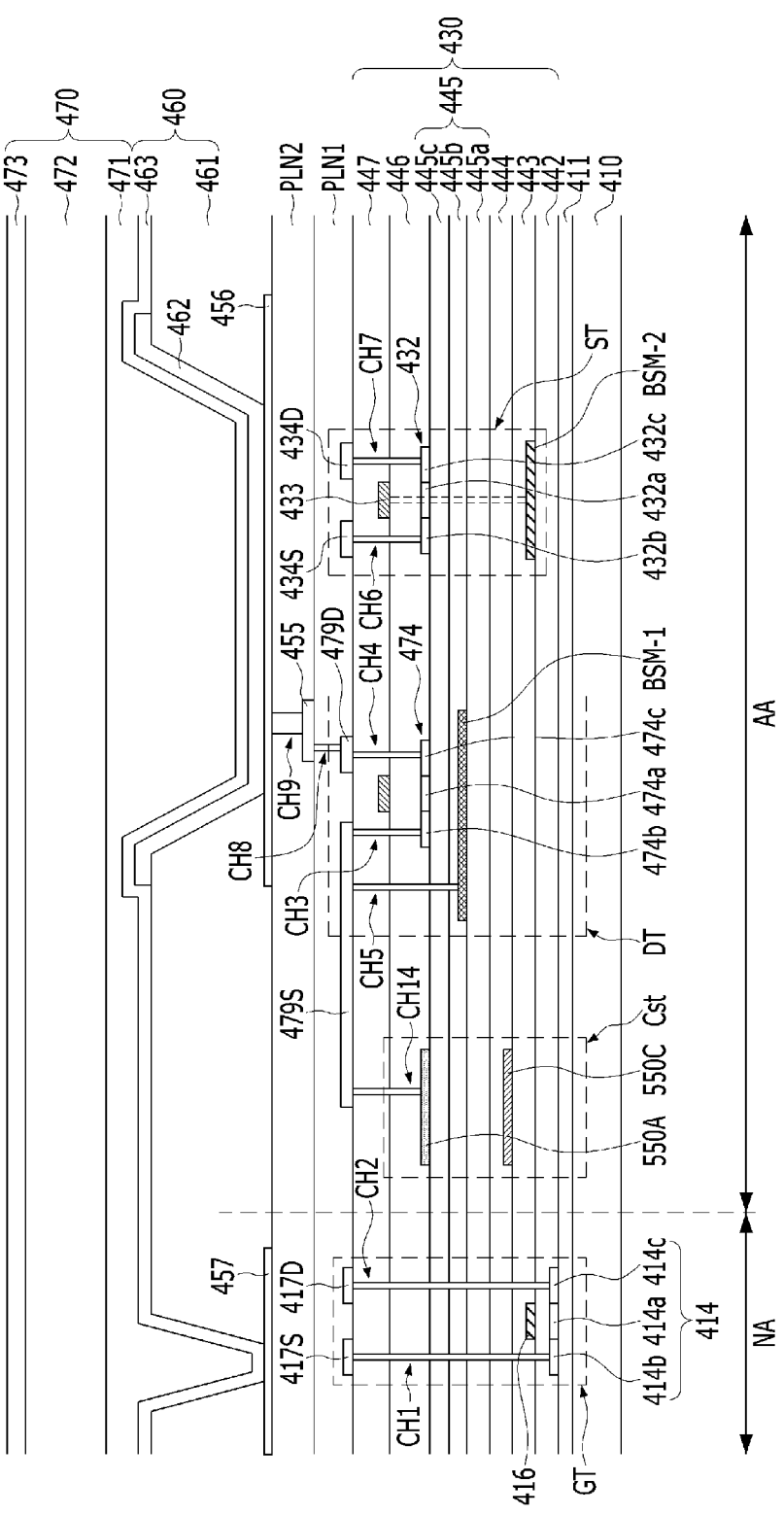

Meanwhile, referring to FIG. 5B, the storage capacitor Cst may include two electrodes and may include a third electrode 550C of the storage capacitor as another electrode overlapping the first electrode 550A of the storage capacitor.

The third electrode 550C of the storage capacitor may be a conductive pattern disposed between the first light shielding pattern BSM-1 and the first gate electrode 416. Specifically, the third electrode 550C of the storage capacitor may be formed on an upper surface of the first interlayer insulation layer 443.

Figure 5C:
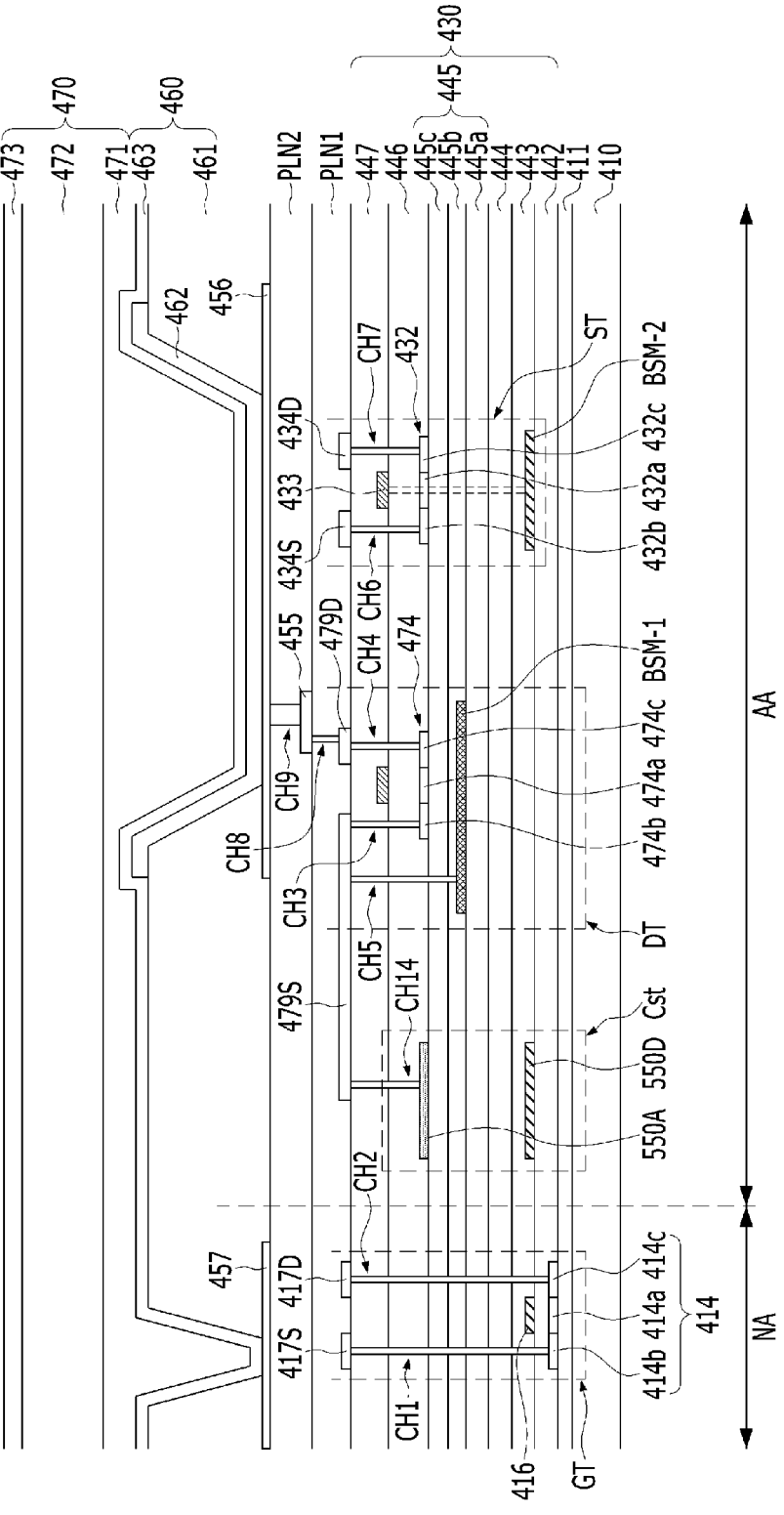

Meanwhile, referring to FIG. 5C, the storage capacitor Cst may include two electrodes and may include a fourth electrode 550D of the storage capacitor as another electrode overlapping the first electrode 550A of the storage capacitor.

The fourth electrode 550D of the storage capacitor may be a conductor made of the same material as the first gate electrode 416 while being formed on the same layer as the first gate electrode 416. In this case, however, the distance between the first electrode 550A of the storage capacitor and the fourth electrode 550D of the storage capacitor is large, whereby capacity of the storage capacitor may be small. Therefore, the configuration of a storage capacitor Cst including at least three storage electrodes will be described with reference to FIGS. 5D to 5F.

Figure 5D:
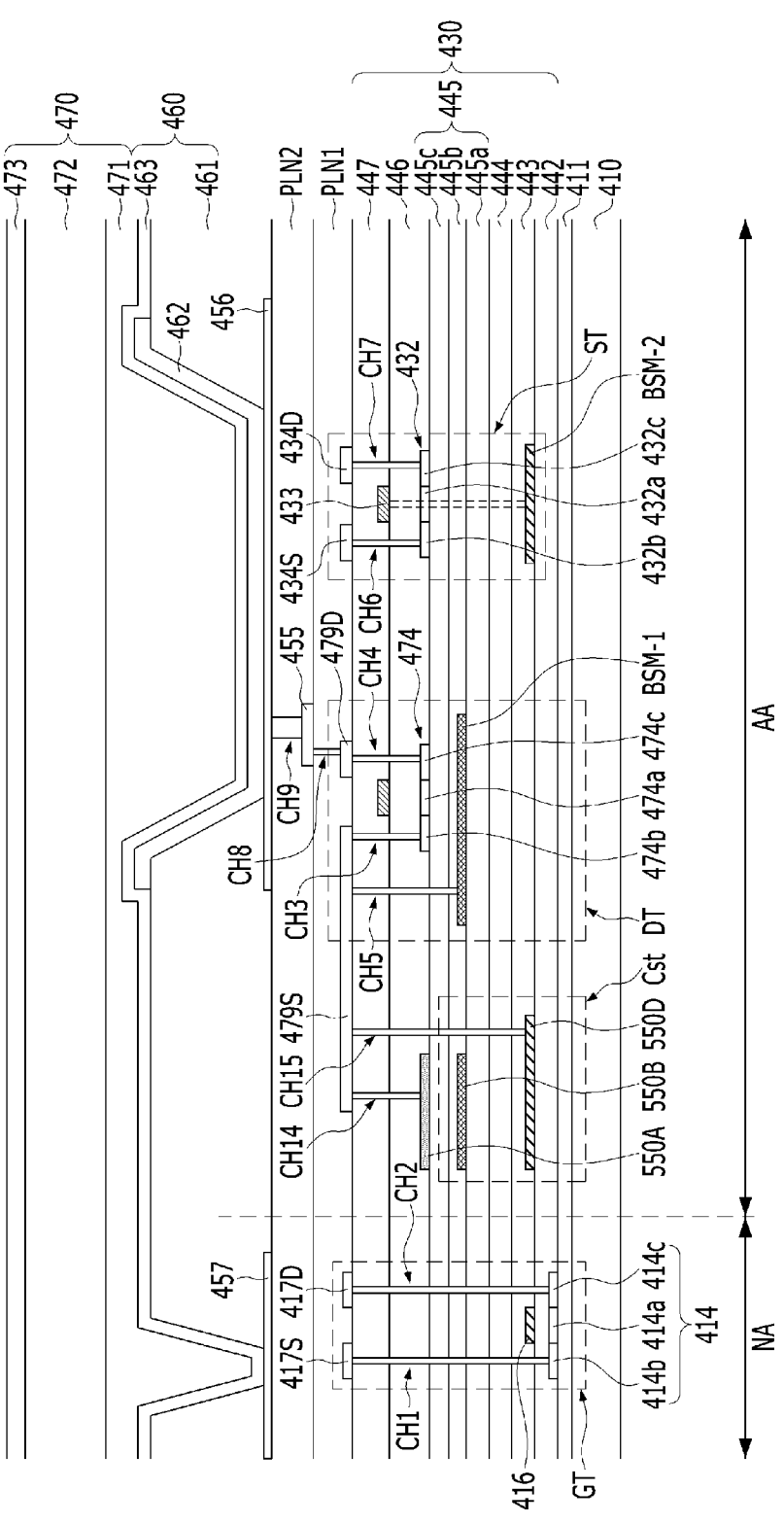

Referring to FIG. 5D, the storage capacitor Cst may include three electrodes. That is, the storage capacitor Cst may include a first electrode 550A of the storage capacitor disposed on the same layer as the first oxide semiconductor pattern 474, a second electrode 550B of the storage capacitor disposed on the same layer as the first light shielding pattern BSM-1, and a fourth electrode 550D of the storage capacitor disposed on the same layer as the first gate electrode 416. The first electrode 550A of the storage capacitor and the fourth electrode 550D of the storage capacitor may be electrically connected to each other. That is, the first electrode 550A of the storage capacitor and the fourth electrode 550D of the storage capacitor may be connected respectively to the second source electrode 479S through a fourteenth contact hole CH14 and a fifteenth contact hole CH15 so as to be electrically connected to each other.

As a result, a first sub-storage capacitor may be formed between the first electrode 550A of the storage capacitor and the second electrode 550B of the storage capacitor, a second sub-storage capacitor may be formed between the second electrode 550B of the storage capacitor and the fourth electrode 550D of the storage capacitor, and the sub-storage capacitors may be connected to each other in parallel, whereby it is possible to increase capacity of the storage capacitor.

Figure 5E:
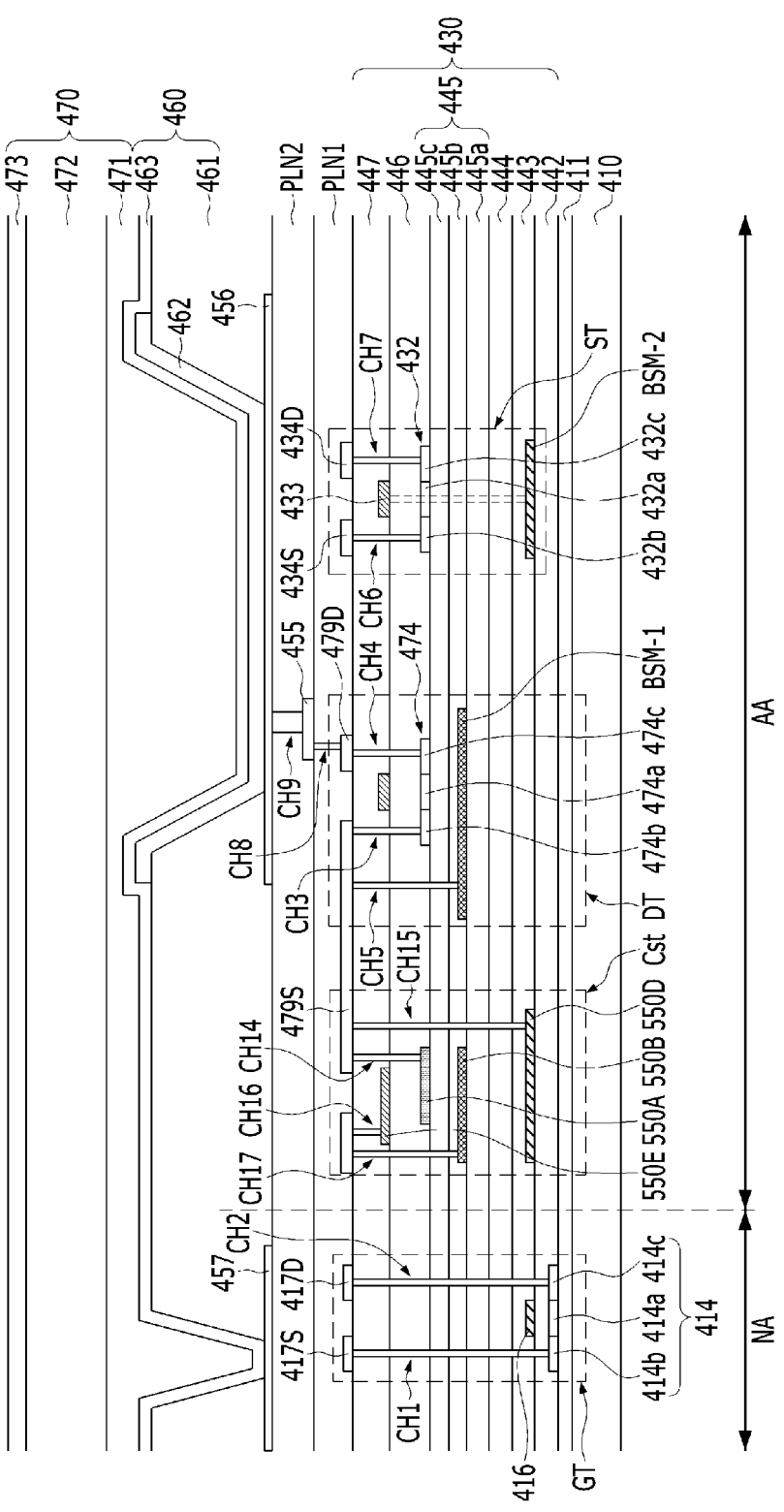

Meanwhile, referring to FIG. 5E, the storage capacitor Cst may include four electrodes. That is, the storage capacitor Cst may include a first electrode 550A of the storage capacitor disposed on the same layer as the first oxide semiconductor pattern 474, a second electrode 550B of the storage capacitor disposed on the same layer as the first light shielding pattern BSM-1, a fourth electrode 550D of the storage capacitor disposed on the same layer as the first gate electrode 416, and a fifth electrode 550E of the storage capacitor disposed on the same layer as the second gate electrode 478. The first electrode 550A of the storage capacitor and the fourth electrode 550D of the storage capacitor may be electrically connected to each other, and the second electrode 550B of the storage capacitor and the fifth electrode 550E of the storage capacitor may be electrically connected to each other. That is, the first electrode 550A of the storage capacitor and the fourth electrode 550D of the storage capacitor may be connected respectively to the second source electrode 479S through a fourteenth contact hole CH14 and a fifteenth contact hole CH15 so as to be electrically connected to each other. In addition, the second electrode 550B of the storage capacitor and the fifth electrode 550E of the storage capacitor may be connected respectively to a conductive layer that may be disposed on the same layer as the second source electrode 479S through a sixteenth contact hole CH16 and a seventeenth contact hole CH17 so as to be electrically connected to each other.

As a result, a first sub-storage capacitor may be formed between the first electrode 550A of the storage capacitor and the fifth electrode 550E of the storage capacitor, a second sub-storage capacitor may be formed between the first electrode 550A of the storage capacitor and the second electrode 550B of the storage capacitor, a third sub-storage capacitor may be formed between the second electrode 550B of the storage capacitor and the fourth electrode 550D of the storage capacitor, and the sub-storage capacitors may be connected to each other in parallel, whereby it is possible to increase capacity of the storage capacitor.

Referring to FIG. 5E, the four electrodes of the storage capacitor Cst may be formed respectively in the same mask processes as the first gate electrode 416, the first light shielding pattern BSM-1, the first oxide semiconductor pattern 474, and the second gate electrode 478, and therefore no separate mask needs to be used to form the electrodes of the storage capacitor Cst.

Figure 5F:
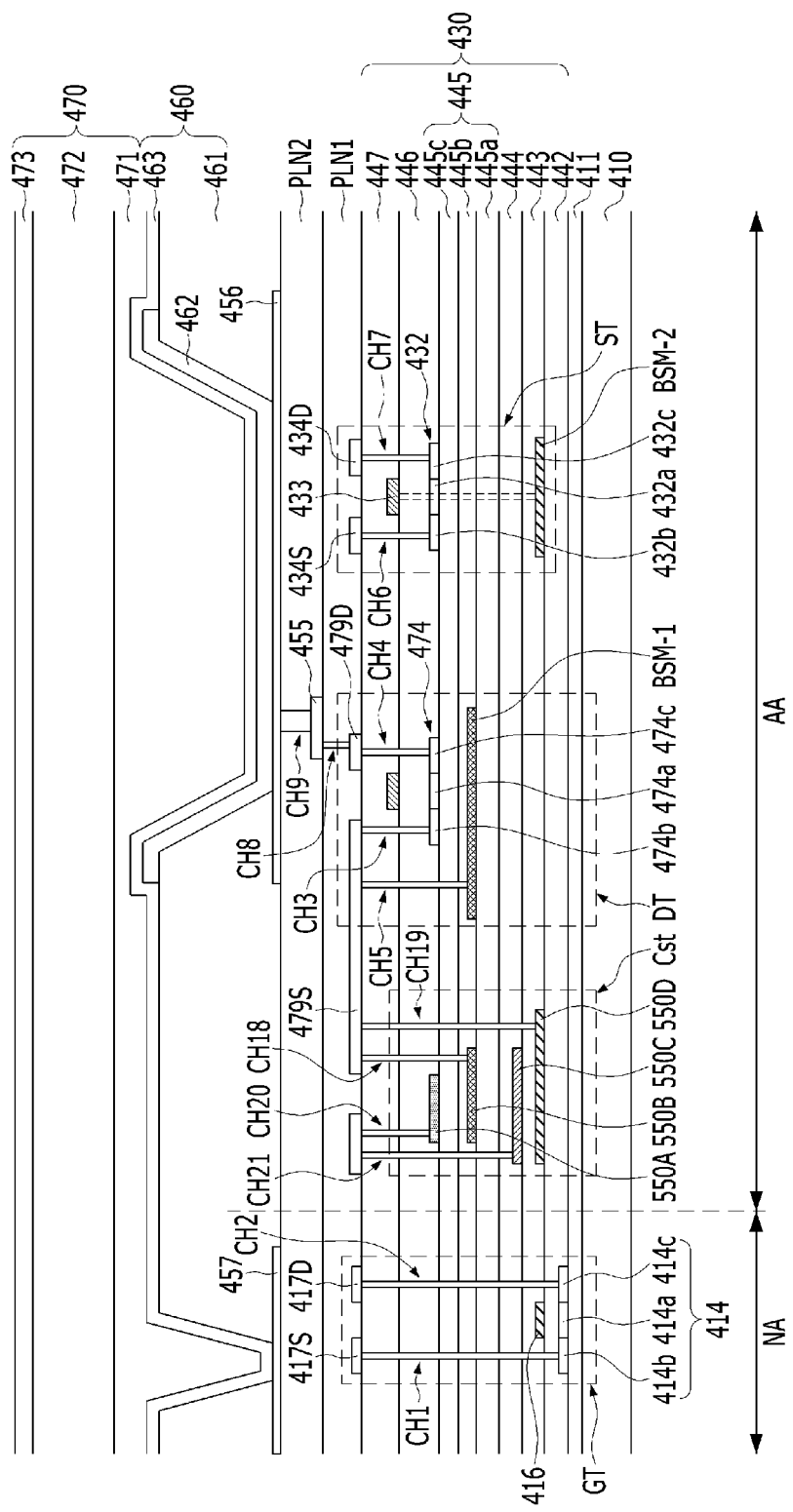

In addition, referring to FIG. 5F, the storage capacitor Cst may include four electrodes, the configuration of which is different from FIG. 5E. That is, the storage capacitor Cst may include a first electrode 550A of the storage capacitor disposed on the same layer as the first oxide semiconductor pattern 474, a second electrode 550B of the storage capacitor disposed on the same layer as the first light shielding pattern BSM-1, a fourth electrode 550D of the storage capacitor disposed on the same layer as the first gate electrode 416, and a third electrode 550C of the storage capacitor disposed between the second electrode 550B of the storage capacitor and the fourth electrode 550D of the storage capacitor. The first electrode 550A of the storage capacitor and the third electrode 550C of the storage capacitor may be electrically connected to each other, and the second electrode 550B of the storage capacitor and the fourth electrode 550D of the storage capacitor may be electrically connected to each other. That is, the first electrode 550A of the storage capacitor and the third electrode 550C of the storage capacitor may be connected to each other via a conductive layer disposed on the same layer as the second source electrode 479S through a twentieth contact hole CH20 and a twenty-first contact hole CH21, respectively. In addition, the second electrode 550B of the storage capacitor and the fourth electrode 550D of the storage capacitor may be connected respectively to the second source electrode 479S through an eighteenth contact hole CH19 and a nineteenth contact hole CH19.

As a result, a first sub-storage capacitor may be formed between the first electrode 550A of the storage capacitor and the second electrode 550B of the storage capacitor, a second sub-storage capacitor may be formed between the second electrode 550B of the storage capacitor and the third electrode 550C of the storage capacitor, a third sub-storage capacitor may be formed between the third electrode 550C of the storage capacitor and the fourth electrode 550D of the storage capacitor, and the sub-storage capacitors may be connected to each other in parallel, whereby it is possible to increase capacity of the storage capacitor.

Meanwhile, referring to FIGS. 6A to 6E, the storage capacitor Cst may include two semiconductor patterns imparted conductivity according to one embodiment.

Figure 6A:
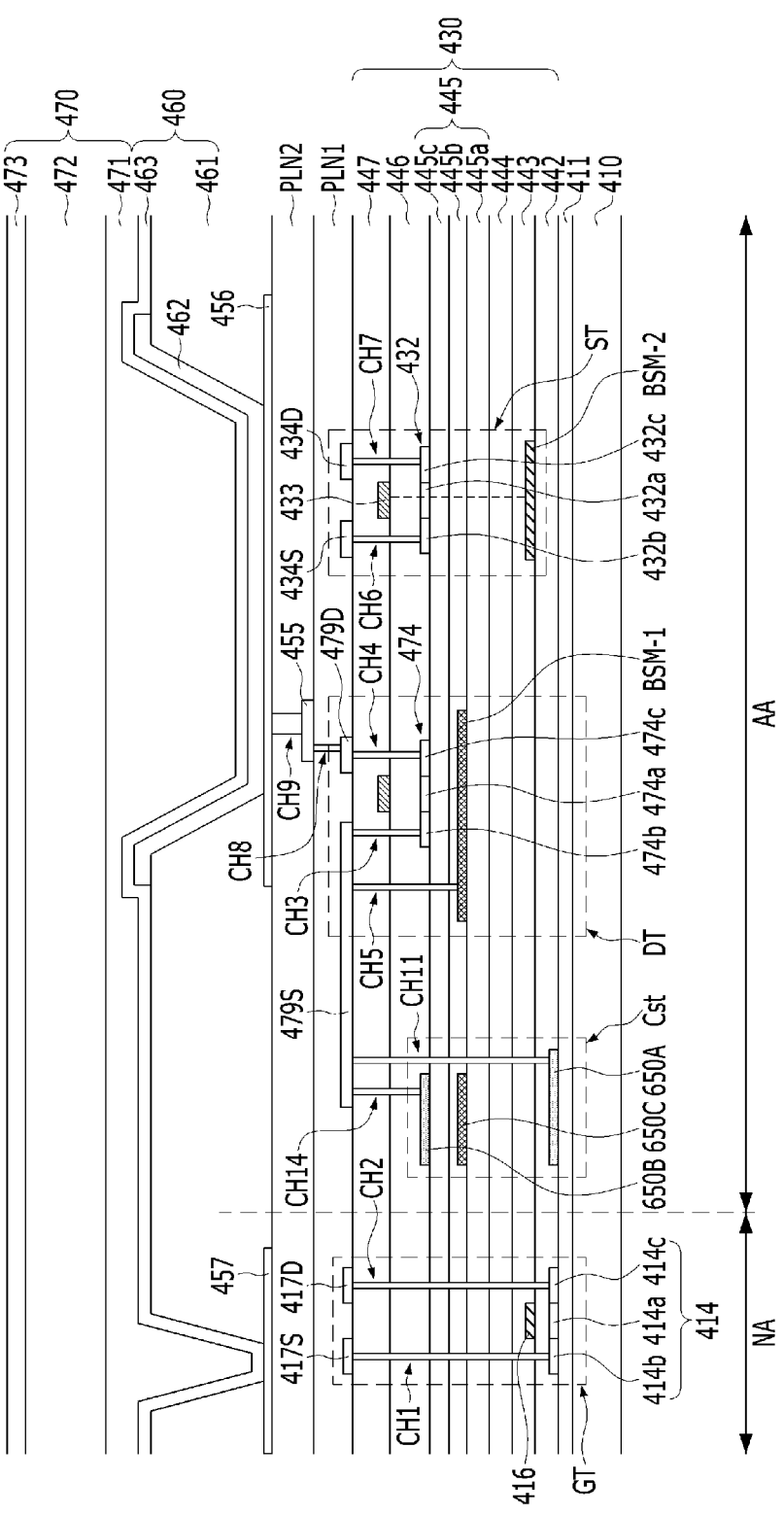

Referring to FIG. 6A, the storage capacitor Cst may include a first electrode 650A of the storage capacitor formed by imparting conductivity to the same material as the first polycrystalline semiconductor pattern 414 on the same layer as the first polycrystalline semiconductor pattern 414, a second electrode 650B of the storage capacitor formed by imparting conductivity to the same material as the first oxide semiconductor pattern 474 on the same layer as the first oxide semiconductor pattern 474, and a third electrode 650C of the storage capacitor disposed between the first electrode 650A of the storage capacitor and the second electrode 650B of the storage capacitor, the third electrode 650C of the storage capacitor being formed of the same material as the first light shielding pattern BSM-1 on the same layer as the first light shielding pattern BSM-1.

The first electrode 650A of the storage capacitor and the second electrode 650B of the storage capacitor may be electrically connected to each other. As a result, a first sub-storage capacitor may be formed between the first electrode 650A of the storage capacitor and the third electrode 650C of the storage capacitor, a second sub-storage capacitor may be formed between the second electrode 650B of the storage capacitor and the third electrode 650C of the storage capacitor, and the sub-storage capacitors may be connected to each other in parallel, whereby it is possible to increase capacity of the storage capacitor.

In addition, referring to FIG. 6A, no separate mask may be used to form the electrodes constituting the storage capacitor, whereby it is possible to reduce the number of masks used.

Figure 6B:
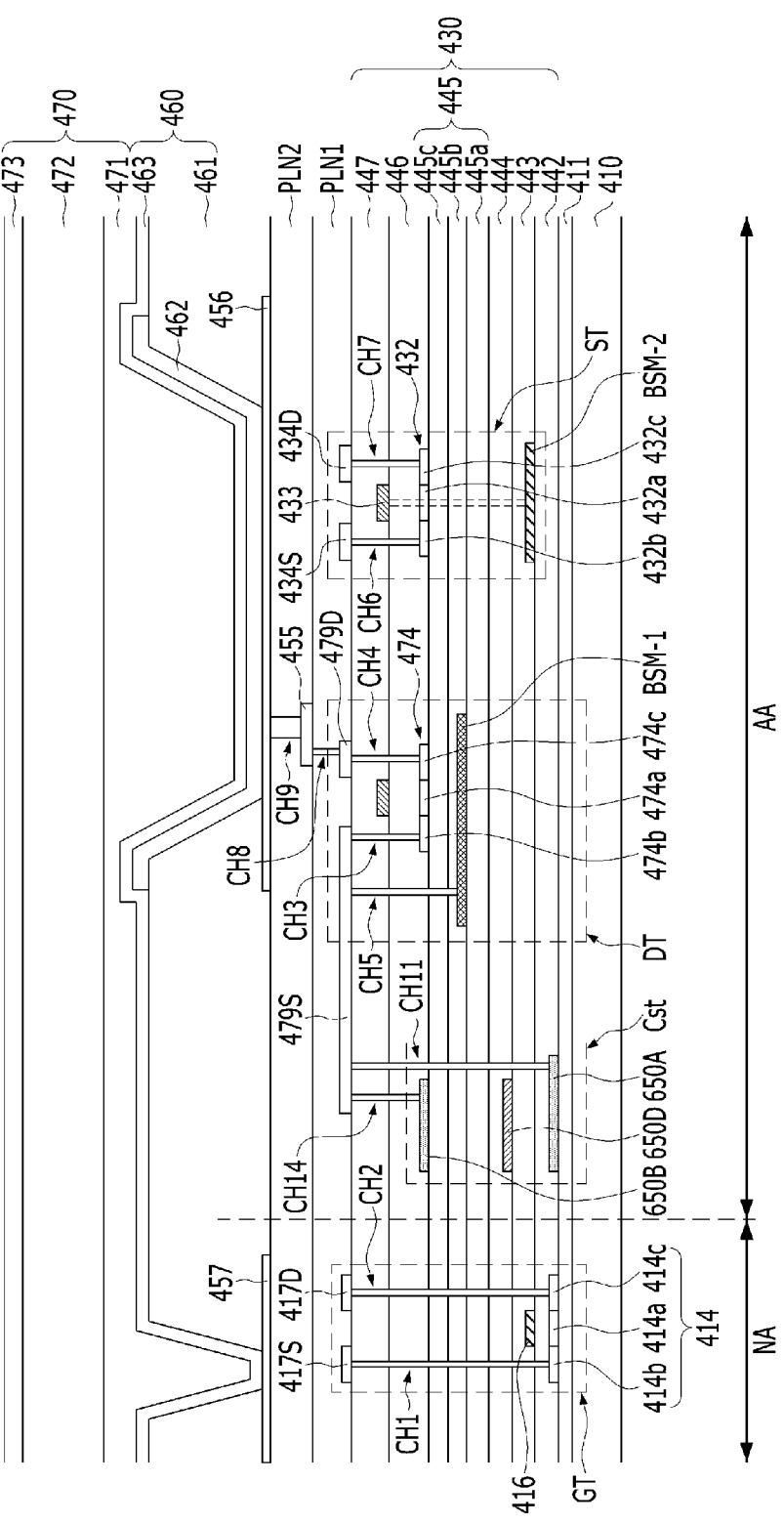

Meanwhile, referring to FIG. 6B, the storage capacitor Cst may include a first electrode 650A of the storage capacitor formed by imparting conductivity to the same material as the first polycrystalline semiconductor pattern 414 on the same layer as the first polycrystalline semiconductor pattern 414, a second electrode 650B of the storage capacitor formed by imparting conductivity to the same material as the first oxide semiconductor pattern 474 on the same layer as the first oxide semiconductor pattern 474, and a fourth electrode 650D of the storage capacitor constituted by a conductive layer disposed between the first electrode 650A of the storage capacitor and the first light shielding pattern BSM-1.

The first electrode 650A of the storage capacitor and the second electrode 650B of the storage capacitor may be electrically connected to each other. As a result, a first sub-storage capacitor may be formed between the first electrode 650A of the storage capacitor and the fourth electrode 650D of the storage capacitor, a second sub-storage capacitor may be formed between the second electrode 650B of the storage capacitor and the fourth electrode 650D of the storage capacitor, and the sub-storage capacitors may be connected to each other in parallel, whereby it is possible to increase capacity of the storage capacitor.

Figure 6C:
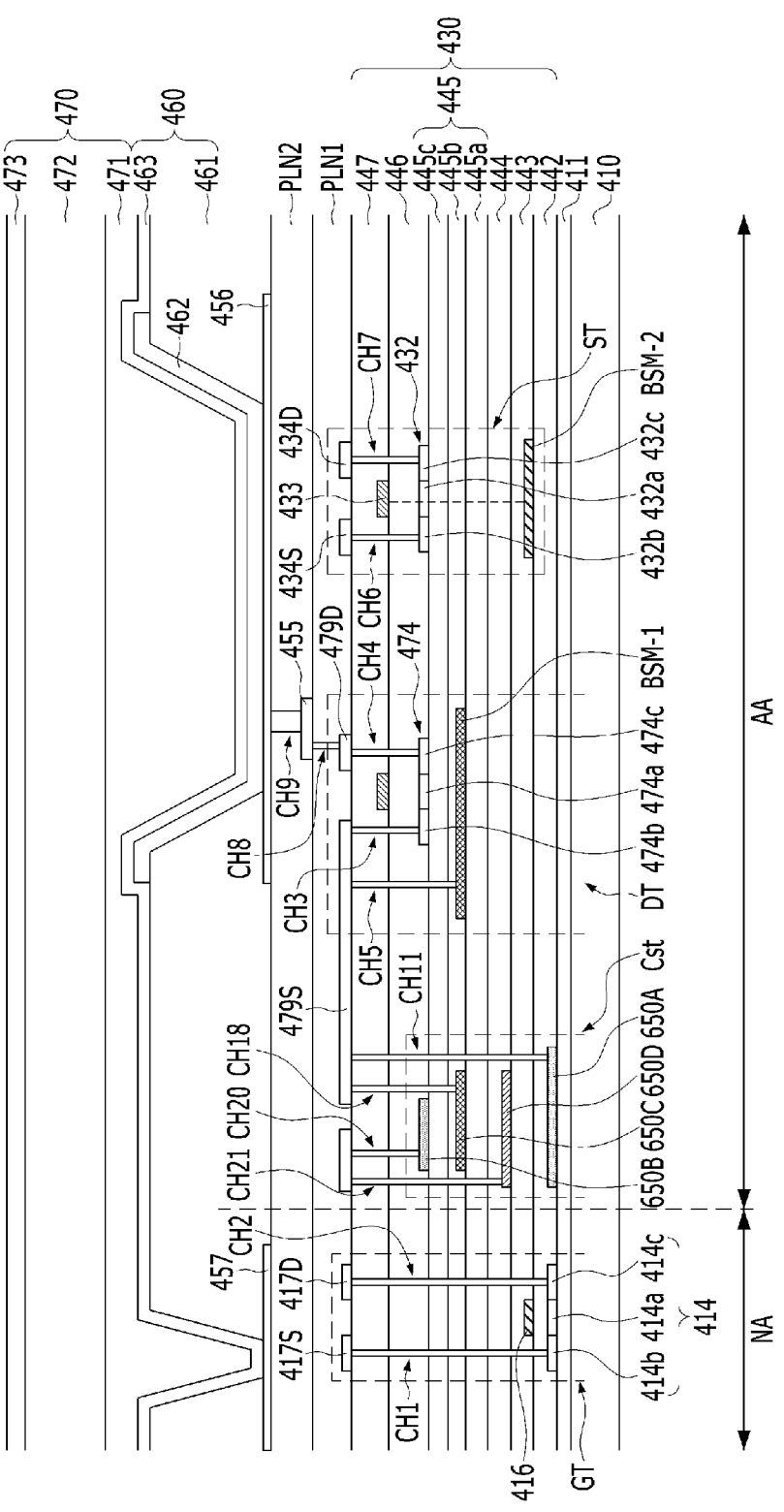
Figure 6D:
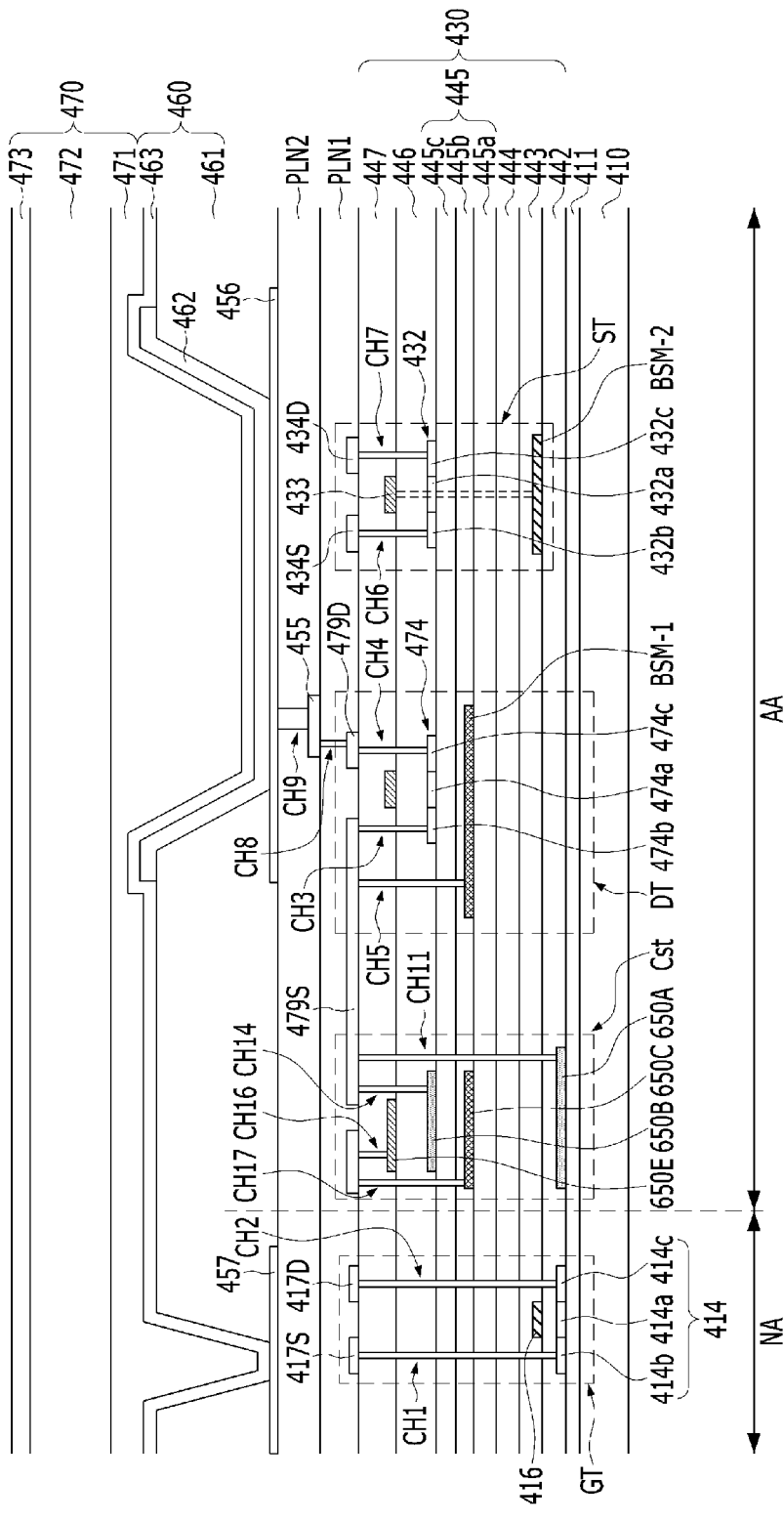
Figure 6E:
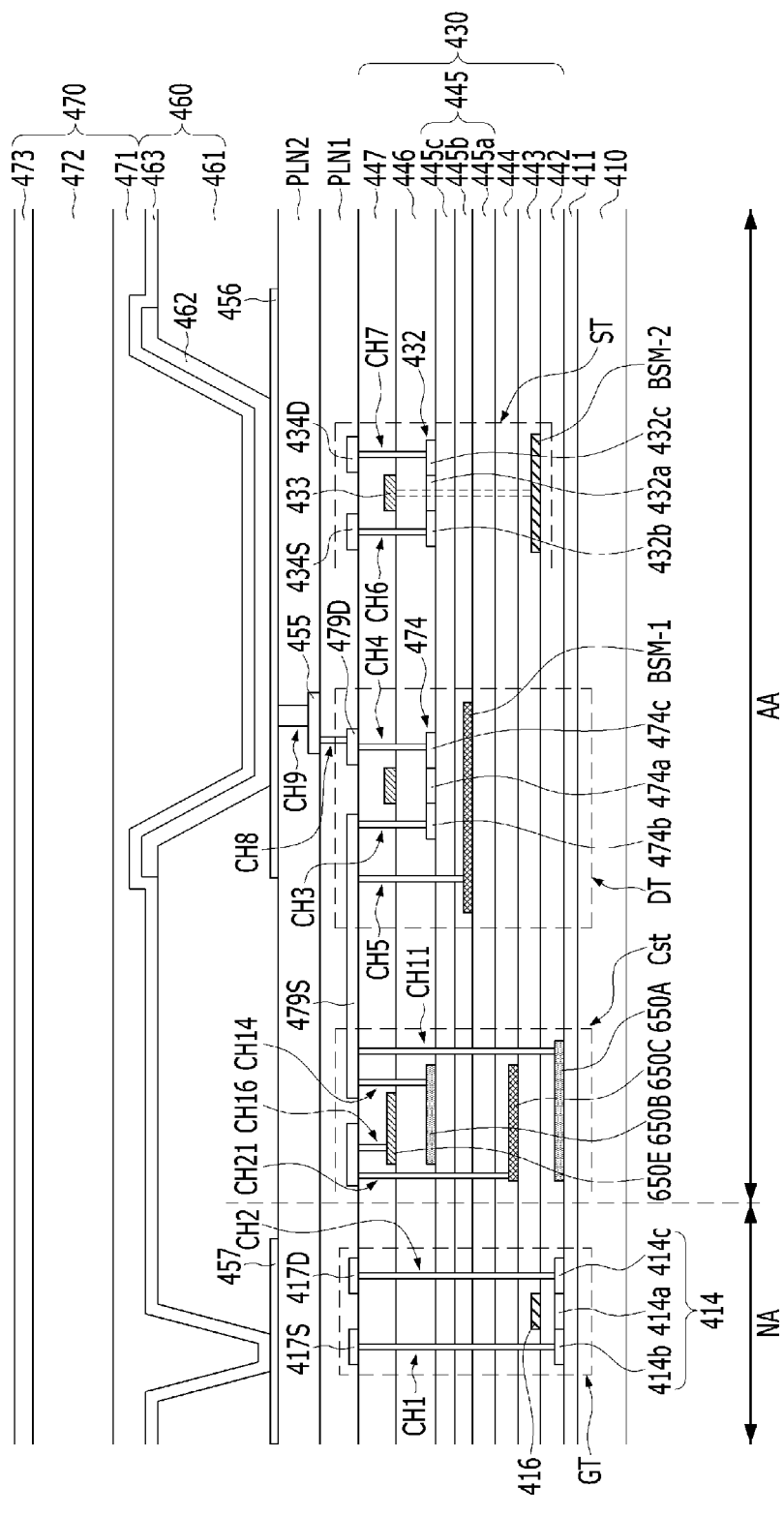

Meanwhile, referring to FIGS. 6C to 6E, the storage capacitor Cst may include four electrodes, (e.g., two semiconductor patterns imparted conductivity and two conductive layers).

Referring to FIG. 6C, the storage capacitor Cst may include a first electrode 650A of the storage capacitor formed by imparting conductivity to the same material as the first polycrystalline semiconductor pattern 414 on the same layer as the first polycrystalline semiconductor pattern 414, a second electrode 650B of the storage capacitor formed by imparting conductivity to the same material as the first oxide semiconductor pattern 474 on the same layer as the first oxide semiconductor pattern 474, a third electrode 650C of the storage capacitor disposed between the first electrode 650A of the storage capacitor and the second electrode 650B of the storage capacitor, the third electrode 650C of the storage capacitor being formed of the same material as the first light shielding pattern BSM-1 on the same layer as the first light shielding pattern BSM-1, and a fourth electrode 650D of the storage capacitor disposed between the first electrode 650A of the storage capacitor and the third electrode 650C of the storage capacitor.

The first electrode 650A of the storage capacitor and the third electrode 650C of the storage capacitor may be electrically connected to each other, and the second electrode 650B of the storage capacitor and the fourth electrode 650D of the storage capacitor may be electrically connected to each other. As a result, a first sub-storage capacitor may be formed between the first electrode 650A of the storage capacitor and the fourth electrode 650D of the storage capacitor, a second sub-storage capacitor may be formed between the third electrode 650C of the storage capacitor and the fourth electrode 650D of the storage capacitor, a third sub-storage capacitor may be formed between the second electrode 650B of the storage capacitor and the third electrode 650C of the storage capacitor, and the sub-storage capacitors may be connected to each other in parallel, whereby it is possible to increase capacity of the storage capacitor.

In addition, referring to FIG. 6D, the storage capacitor Cst may include a first electrode 650A of the storage capacitor formed by imparting conductivity to the same material as the first polycrystalline semiconductor pattern 414 on the same layer as the first polycrystalline semiconductor pattern 414, a second electrode 650B of the storage capacitor formed by imparting conductivity to the same material as the first oxide semiconductor pattern 474 on the same layer as the first oxide semiconductor pattern 474, a third electrode 650C of the storage capacitor disposed between the first electrode

650A of the storage capacitor and the second electrode 650B of the storage capacitor, the third electrode 650C of the storage capacitor being formed of the same material as the first light shielding pattern BSM-1 on the same layer as the first light shielding pattern BSM-1, and a fifth electrode 650E of the storage capacitor formed of the same material as the second gate electrode 478 on the same layer as the second gate electrode 478.

The first electrode 650A of the storage capacitor and the second electrode 650B of the storage capacitor may be electrically connected to each other, and the third electrode 650C of the storage capacitor and the fifth electrode 650E of the storage capacitor may be electrically connected to each other. As a result, a first sub-storage capacitor may be formed between the first electrode 650A of the storage capacitor and the third electrode 650C of the storage capacitor, a second sub-storage capacitor may be formed between the second electrode 650B of the storage capacitor and the third electrode 650C of the storage capacitor, a third sub-storage capacitor may be formed between the second electrode 650B of the storage capacitor and the fifth electrode 650E of the storage capacitor, and the sub-storage capacitors may be connected to each other in parallel, whereby it is possible to increase capacity of the storage capacitor.

In addition, referring to FIG. 6E, the storage capacitor Cst may include a first electrode 650A of the storage capacitor formed by imparting conductivity to the same material as the first polycrystalline semiconductor pattern 414 on the same layer as the first polycrystalline semiconductor pattern 414, a second electrode 650B of the storage capacitor formed by imparting conductivity to the same material as the first oxide semiconductor pattern 474 on the same layer as the first oxide semiconductor pattern 474, a fourth electrode 650D of the storage capacitor constituted by a conductive layer disposed between the first light shielding pattern BSM-1 and the first electrode 650A of the storage capacitor, and a fifth electrode 650E of the storage capacitor disposed on the same layer as the second gate electrode 478.

The first electrode 650A of the storage capacitor and the second electrode 650B of the storage capacitor may be electrically connected to each other, and the fourth electrode 650D of the storage capacitor and the fifth electrode 650E of the storage capacitor may be electrically connected to each other. As a result, a first sub-storage capacitor may be formed between the first electrode 650A of the storage capacitor and the fourth electrode 650D of the storage capacitor, a second sub-storage capacitor may be formed between the second electrode 650B of the storage capacitor and the fourth electrode 650D of the storage capacitor, a third sub-storage capacitor may be formed between the second electrode 650B of the storage capacitor and the fifth electrode 650E of the storage capacitor, and the sub-storage capacitors may be connected to each other in parallel, whereby it is possible to increase capacity of the storage capacitor.

Meanwhile, referring to FIG. 4A, a first planarization layer PLN1 is formed on the substrate 410 on which the driving thin film transistor DT and the first switching thin film transistor ST are disposed. The first planarization layer PLN1 may be made of an organic material, such as photo acrylic, or may be configured so as to have a plurality of layers including an inorganic layer and an organic layer. A connection electrode 455 is formed on the first planarization layer PLN1. The connection electrode 455 is connected to an anode 456, which is one component of a light emitting device unit 460, through a ninth contact hole CH9 and is connected to a second drain electrode 479D through an eighth contact hole CH8 to electrically connect a pixel circuit unit 430 and the light emitting device unit 460 to each other.

A second planarization layer PLN2 may be formed on the connection electrode 455. The second planarization layer PLN2 may be made of an organic material, such as photo acrylic, or may be configured so as to have a plurality of layers including an inorganic layer and an organic layer, as in the first planarization layer PLN1.

An anode 456, which is connected to the connection electrode 455 through the ninth contact hole CH9, is formed on the second planarization layer PLN2. The anode 456 may be constituted by a single layer or a plurality of layers made of Ca, Ba, Mg, Al, or Ag, or an alloy thereof. In addition to the anode 456, an anode connection electrode 457 configured to electrically connect a common voltage line VSS and a cathode 463 may be further provided in the non-active area NA.

A bank layer 461 is formed on the second planarization layer PLN2. The bank layer 461, which is a kind of partition wall, may partition subpixels from each other to prevent mixed output of specific colors of light output from adjacent subpixels.

An organic light emitting layer 462 is formed on the anode 456 and a part of an incline of the bank layer 461. The organic light emitting layer 462 may be an R-organic light emitting layer formed in each subpixel to emit red light, a G-organic light emitting layer formed in each subpixel to emit green light, or a B-organic light emitting layer formed in each subpixel to emit blue light. In addition, the organic light emitting layer 462 may be a W-organic light emitting layer configured to emit white light.

In addition to the light emitting layer, the organic light emitting layer 462 may include an electron injection layer and a hole injection layer configured respectively to inject electrons and holes into the light emitting layer and an electron transport layer and a hole transport layer configured respectively to transport the injected electrons and holes into the organic layer.

A cathode 463 is formed on the organic light emitting layer 462. The cathode 463 may be made of a transparent conductive material, such as indium tin oxide (ITO) or indium zinc oxide (IZO), or a thin metal that transmits visible light; however, the present disclosure is not limited thereto.

An encapsulation layer unit 470 is formed on the cathode 463. The encapsulation layer unit 470 may be configured to have a single layer, such as an inorganic layer, may be configured to have two layers, (e.g., an inorganic layer and an organic layer), or may be configured to have three layers, (e.g., an inorganic layer, an organic layer, and an inorganic layer). The inorganic layer may be made of an inorganic material, such as SiNx or SiO2. However, the present disclosure is not limited thereto. In addition, the organic layer may be made of an organic material, such as polyethylene terephthalate, polyethylene naphthalate, polycarbonate, polyimide, polyethylene sulfonate, polyoxymethylene, or polyacrylate, or a mixture thereof; however, the present disclosure is not limited thereto.

FIG. 4A shows that the encapsulation layer unit 470 includes three layers, (e.g., an inorganic layer 471, an organic layer 472, and an inorganic layer 473), as an embodiment.

A cover glass (not shown) may be disposed on the encapsulation layer unit 470 and may be attached thereto via an adhesive layer (not shown). Any material that exhibits strong adhesion force and high heat resistance and water resistance may be used as the adhesive layer. In the present disclosure, a thermosetting resin, such as an epoxy-based compound, an acrylate-based compound, or acrylic-based rubber, may be used. In addition, a photocurable resin may be used as the adhesive. In this case, light, such as ultraviolet light, is radiated to the adhesive layer to harden the adhesive layer.

The adhesive layer may serve as an encapsulant configured to prevent permeation of moisture into the organic light emitting display apparatus in addition to lamination between substrate 410 and the cover glass (not shown).

A protective film, such as a polystyrene film, a polyethylene (PE) film, a polyethylene naphthalate (PEN) film, or a polyimide (PI) film, or glass may be used as the cover glass (not shown), which is an encapsulation cap configured to encapsulate the organic light emitting display apparatus.

Referring to FIG. 4, as an embodiment of the present disclosure, there is shown a subpixel including one driving thin film transistor DT using an oxide semiconductor material as an active layer and one switching thin film transistor ST using an oxide semiconductor material as an active layer. However, the subpixel may further include a third switching thin film transistor using a polycrystalline semiconductor material as an active layer. Furthermore, each of the thin film transistors disposed in the subpixel may use an oxide semiconductor material as an active layer.

In an organic light emitting display apparatus according to the present disclosure, sufficient capacitance is secured within a small area, and a semiconductor pattern is imparted conductivity so as to be used as an electrode of a storage capacitor, whereby it is possible to diversify the electrode configuration of the storage capacitor. In addition, capacitor electrodes are disposed so as to be connected to each other in parallel, whereby it is possible to implement a pixel circuit capable of securing sufficient capacitance within a unit area even though a display apparatus implements high resolution. Furthermore, a semiconductor pattern is imparted conductivity so as to be used as an electrode of the capacitor, whereby it is possible to increase capacity of the storage capacitor while reducing the number of masks used.

In addition, different semiconductor patterns are used, whereby it is possible to implement a capacitor having high capacitance while reducing a mask process in a stacked structure of a pixel having a stacked structure of a plurality of inorganic insulation layers and metal layers.

The above description and the accompanying drawings merely illustrate the technical idea of the present disclosure, and those skilled in the art will appreciate that various modifications or variations, such as coupling, separation, replacement, and change of components, can be made without departing from essential characteristics of the present disclosure. The disclosed embodiments are therefore to be construed in all aspects as illustrative and not restrictive, and the scope of technical idea of the present disclosure is not limited by the embodiments. The scope of protection of the present disclosure must be interpreted based on the appended claims, and all technical ideas within an equivalent range of the present disclosure must be interpreted to fall within the scope of the rights of the present disclosure.

What is claimed is:

1. An organic light emitting display apparatus comprising:
   a substrate comprising an active area and a non-active area disposed around the active area;
   a lower buffer layer on the substrate;
   a first thin film transistor in at least one of the active area and the non-active area, the first thin film transistor comprising a first semiconductor pattern, a first gate electrode, a first source electrode, and a first drain electrode on the lower buffer layer;

an upper buffer layer on the first semiconductor pattern;

a second thin film transistor on the upper buffer layer in the active area, the second thin film transistor comprising a second semiconductor pattern, a second gate electrode, a second source electrode, and a second drain electrode;

a first light shielding pattern between the lower buffer layer and the second semiconductor pattern, the first light shielding pattern overlapping the second semiconductor pattern; and a storage capacitor comprising at least two electrodes that overlap each other, the at least two electrodes comprising at least one of a conductive pattern formed by imparting conductivity to a same material as the first semiconductor pattern and a conductive pattern formed by imparting conductivity to the second semiconductor pattern, wherein the first semiconductor pattern comprises a polycrystalline semiconductor material.

2. The organic light emitting display apparatus according to claim 1, wherein the second semiconductor pattern comprises an oxide semiconductor material, and wherein the second thin film transistor is a driving thin film transistor.

3. The organic light emitting display apparatus according to claim 1, wherein the first light shielding pattern is in the upper buffer layer and is electrically connected to the second source electrode.

4. The organic light emitting display apparatus according to claim 1, wherein the storage capacitor comprises:

a first electrode of the storage capacitor formed by imparting conductivity to a same material as the first semiconductor pattern; and a second electrode of the storage capacitor comprising a conductive layer between the first semiconductor pattern and the second gate electrode.

5. The organic light emitting display apparatus according to claim 4, wherein the second electrode of the storage capacitor is any one of a conductive layer disposed on a same layer as the first light shielding pattern and a conductive layer disposed between the first gate electrode and the first light shielding pattern.

6. The organic light emitting display apparatus according to claim 1, wherein the storage capacitor comprises:

a first electrode of the storage capacitor formed by imparting conductivity to a same material as the first semiconductor pattern;

a second electrode of the storage capacitor formed by imparting conductivity to a same material as the second semiconductor pattern; and a third electrode of the storage capacitor on a same layer as the first light shielding pattern, the third electrode of the storage capacitor comprising a same material as the first light shielding pattern, and wherein the first electrode of the storage capacitor and the second electrode of the storage capacitor are electrically connected to each other.

7. The organic light emitting display apparatus according to claim 1, wherein the storage capacitor comprises:

a first electrode of the storage capacitor formed by imparting conductivity to a same material as the first semiconductor pattern;

a second electrode of the storage capacitor comprising a conductive layer disposed between the first semiconductor pattern and the first light shielding pattern;

a third electrode of the storage capacitor on a same layer as the first light shielding pattern, the third electrode of the storage capacitor comprising a same material as the first light shielding pattern; and a fourth electrode of the storage capacitor on a same layer as the second gate electrode, the fourth electrode of the storage capacitor comprising a same material as the second gate electrode, wherein the first electrode of the storage capacitor and the third electrode of the storage capacitor are electrically connected to each other, and the second electrode of the storage capacitor and the fourth electrode of the storage capacitor are electrically connected to each other.

8. The organic light emitting display apparatus according to claim 1, wherein the storage capacitor comprises:

a first electrode of the storage capacitor formed by imparting conductivity to a same material as the second semiconductor pattern; and a second electrode of the storage capacitor on a same layer as the first light shielding pattern, the second electrode of the storage capacitor being made of a same material as the first light shielding pattern.

9. The organic light emitting display apparatus according to claim 1, wherein the storage capacitor comprises:

a first electrode of the storage capacitor made of a same material as the second semiconductor pattern; and a second electrode of the storage capacitor comprising a metal layer between the first light shielding pattern and the first semiconductor pattern.

10. The organic light emitting display apparatus according to claim 1, wherein the storage capacitor comprises:

a first electrode of the storage capacitor formed by imparting conductivity to a same material as the second semiconductor pattern; and a second electrode of the storage capacitor on a same layer as the first gate electrode, the second electrode of the storage capacitor comprising a same material as the first gate electrode.

11. The organic light emitting display apparatus according to claim 1, wherein the storage capacitor comprises:

a first electrode of the storage capacitor formed by imparting conductivity to a same material as the first semiconductor pattern;

a second electrode of the storage capacitor formed by imparting conductivity to a same material as the second semiconductor pattern; and a third electrode of the storage capacitor disposed between the first semiconductor pattern and the first light shielding pattern, and wherein the first electrode of the storage capacitor and the second electrode of the storage capacitor are electrically connected to each other.

12. The organic light emitting display apparatus according to claim 1, wherein the storage capacitor comprises:

a first electrode of the storage capacitor formed by imparting conductivity to a same material as the second semiconductor pattern;

a second electrode of the storage capacitor on a same layer as the first light shielding pattern, the second electrode of the storage capacitor comprising a same material as the first light shielding pattern;

a third electrode of the storage capacitor disposed on a same layer as the first gate electrode, the third electrode of the storage capacitor comprising a same material as the first gate electrode; and a fourth electrode of the storage capacitor on a same layer as the second gate electrode, the fourth electrode of the storage capacitor comprising a same material as the second gate electrode, and wherein the first electrode of the storage capacitor and the third electrode of the storage capacitor are electrically connected to each other, and the second electrode of the storage capacitor and the fourth electrode of the storage capacitor are electrically connected to each other.

13. The organic light emitting display apparatus according to claim 1, wherein the storage capacitor comprises:

a first electrode of the storage capacitor formed by imparting conductivity to a same material as the second semiconductor pattern;

a second electrode of the storage capacitor on a same layer as the first light shielding pattern, the second electrode of the storage capacitor comprising a same material as the first light shielding pattern;

a third electrode of the storage capacitor comprising a conductive layer between the first gate electrode and the first light shielding pattern; and a fourth electrode of the storage capacitor on a same layer as the first gate electrode, the fourth electrode of the storage capacitor comprising a same material as the first gate electrode, and wherein the first electrode of the storage capacitor and the third electrode of the storage capacitor are electrically connected to each other, and the second electrode of the storage capacitor and the fourth electrode of the storage capacitor are electrically connected to each other.

14. The organic light emitting display apparatus according to claim 1, wherein the storage capacitor comprises:

a first electrode of the storage capacitor formed by imparting conductivity to a same material as the first semiconductor pattern;

a second electrode of the storage capacitor comprising a same material as the second semiconductor pattern; and a third electrode of the storage capacitor comprising a conductive layer between the first electrode of the storage capacitor and the second electrode of the storage capacitor.

15. The organic light emitting display apparatus according to claim 14, wherein the third electrode of the storage capacitor is a conductive layer on a same layer as the first light shielding pattern and made of a same material as the first light shielding pattern.

16. The organic light emitting display apparatus according to claim 14, wherein the third electrode of the storage capacitor comprises a conductive layer between the first gate electrode and the first light shielding pattern.

17. The organic light emitting display apparatus according to claim 1, wherein the storage capacitor comprises:

a first electrode of the storage capacitor formed by imparting conductivity to a same material as the first semiconductor pattern;

a second electrode of the storage capacitor formed by imparting conductivity to a same material as the second semiconductor pattern;

a third electrode of the storage capacitor on a same layer as the first light shielding pattern, the third electrode of the storage capacitor comprising a same material as the first light shielding pattern; and a fourth electrode of the storage capacitor comprising a conductive layer between the first electrode of the storage capacitor and the third electrode of the storage capacitor, and wherein the first electrode of the storage capacitor and the third electrode of the storage capacitor are electrically connected to each other, and the second electrode of the storage capacitor and the fourth electrode of the storage capacitor are electrically connected to each other.

18. The organic light emitting display apparatus according to claim 1, wherein the storage capacitor comprises:

a first electrode of the storage capacitor formed by imparting conductivity to the same material as the first semiconductor pattern;

a second electrode of the storage capacitor formed by imparting conductivity to a same material as the second semiconductor pattern;

a third electrode of the storage capacitor comprising a conductive layer between the first electrode of the storage capacitor and the second electrode of the storage capacitor; and a fourth electrode of the storage capacitor comprising a conductive layer on the second electrode of the storage capacitor, and wherein the first electrode of the storage capacitor and the second electrode of the storage capacitor are electrically connected to each other, and the third electrode of the storage capacitor and the fourth electrode of the storage capacitor are electrically connected to each other.

19. The organic light emitting display apparatus according to claim 18, wherein the third electrode of the storage capacitor is any one of a conductive layer on a same layer as the first light shielding pattern and a conductive layer between the first electrode of the storage capacitor and the first light shielding pattern, and wherein the fourth electrode of the storage capacitor is on a same layer as the second gate electrode and comprises a same material as the second gate electrode.

* * * * *